(12) United States Patent
Boggs et al.

(10) Patent No.: US 8,304,344 B2
(45) Date of Patent: Nov. 6, 2012

(54) HIGH THROUGHPUT CHEMICAL MECHANICAL POLISHING COMPOSITION FOR METAL FILM PLANARIZATION

(75) Inventors: Karl E. Boggs, Hopewell Junction, NY (US); Michael S. Darsillo, Landenberg, PA (US); Peter Wrschka, Phoenix, AZ (US); James Welch, Clayton, NC (US)

(73) Assignee: Advanced Technology Materials, Inc., Danbury, CT (US)

( * ) Notice: Subject to any disclaimer, the term of this patent is extended or adjusted under 35 U.S.C. 154(b) by 1009 days.

(21) Appl. No.: 12/026,414

(22) Filed: Feb. 5, 2008

(65) Prior Publication Data

US 2008/0254628 A1    Oct. 16, 2008

Related U.S. Application Data

(63) Continuation-in-part of application No. PCT/US2006/030508, filed on Aug. 7, 2006.

(60) Provisional application No. 60/706,206, filed on Aug. 5, 2005.

(51) Int. Cl.
H01L 21/302 (2006.01)
(52) U.S. Cl. .................. 438/693; 438/689; 438/692
(58) Field of Classification Search .................. 438/689, 438/692, 693; 451/41; 51/306, 307
See application file for complete search history.

(56) References Cited

U.S. PATENT DOCUMENTS

| | | | |
|---|---|---|---|
| 5,266,088 A | 11/1993 | Sandusky et al. | |
| 5,976,928 A | 11/1999 | Kirlin et al. | |
| 6,316,365 B1 | 11/2001 | Wang et al. | |
| 6,322,600 B1 | 11/2001 | Brewer et al. | |
| 6,346,741 B1 | 2/2002 | Van Buskirk et al. | |
| 6,350,690 B1 | 2/2002 | Schwartz et al. | |
| 6,368,955 B1 | 4/2002 | Easter et al. | |
| 6,395,194 B1 | 5/2002 | Russell et al. | |
| 6,409,781 B1 | 6/2002 | Wojtczak et al. | |
| 6,561,883 B1 | 5/2003 | Kondo et al. | |
| 6,585,568 B2 | 7/2003 | Tsuchiya et al. | |
| 6,720,264 B2* | 4/2004 | Sahota et al. | 438/692 |
| 6,802,983 B2 | 10/2004 | Mullee et al. | |
| 6,910,954 B2* | 6/2005 | Kim et al. | 451/60 |
| 7,004,824 B1* | 2/2006 | Madanshetty | 451/60 |
| 7,361,603 B2 | 4/2008 | Liu et al. | |
| 7,947,170 B2* | 5/2011 | Golden et al. | 210/85 |
| 2002/0095872 A1* | 7/2002 | Tsuchiya et al. | 51/307 |
| 2002/0124474 A1 | 9/2002 | Wojtczak et al. | |

(Continued)

FOREIGN PATENT DOCUMENTS

WO    2006133249 A2    12/2006

*Primary Examiner* — Lan Vinh
*Assistant Examiner* — Maki Angadi
(74) *Attorney, Agent, or Firm* — Tristan A. Fuierer; Moore & Van Allen, PLLC; Rosa Yaghmour

(57) ABSTRACT

A chemical mechanical polishing process including a single copper removal CMP slurry formulation for planarization of a microelectronic device structure preferably having copper deposited thereon. The process includes the bulk removal of a copper layer using a first CMP slurry formulation having oxidizing agent, passivating agent, abrasive and solvent, and the soft polishing and over-polishing of the microelectronic device structure using a formulation including the first CMP slurry formulation and at least one additional additive. The CMP process described herein provides a high copper removal rate, a comparatively low barrier material removal rate, appropriate material selectivity ranges to minimize copper dishing at the onset of barrier material exposure, and good planarization efficiency.

18 Claims, 21 Drawing Sheets

U.S. PATENT DOCUMENTS

| | | |
|---|---|---|
| 2003/0040182 A1 | 2/2003 | Hsu et al. |
| 2003/0047539 A1 | 3/2003 | Ma et al. |
| 2003/0073386 A1* | 4/2003 | Ma et al. ................ 451/41 |
| 2003/0079416 A1 | 5/2003 | Ma et al. |
| 2003/0087525 A1 | 5/2003 | Sinha et al. |
| 2004/0067649 A1 | 4/2004 | Hellring et al. |
| 2004/0108302 A1 | 6/2004 | Liu et al. |
| 2004/0229461 A1 | 11/2004 | Darsillo et al. |
| 2004/0253822 A1 | 12/2004 | Matsui et al. |
| 2005/0090106 A1 | 4/2005 | Bian |
| 2006/0135046 A1* | 6/2006 | Prince et al. ................ 451/41 |
| 2006/0249482 A1 | 11/2006 | Wrschka et al. |

* cited by examiner

HIGH THROUGHPUT CHEMICAL MECHANICAL POLISHING COMPOSITION FOR METAL FILM PLANARIZATION

CROSS REFERENCE TO RELATED APPLICATIONS

This is a continuation-in-part of the PCT Patent Application No. PCT/US06/30508 for "High Throughput Chemical Mechanical Polishing Composition for Metal Film Planarization" filed on Aug. 7, 2006 in the name of Karl E. Boggs et al., which claims priority to U.S. Provisional Patent Application No. 60/706,206 filed Aug. 5, 2005, both of which are incorporated by reference herein in their entirety.

FIELD OF THE INVENTION

The present invention relates to chemical mechanical polishing (CMP) compositions and processes for the polishing of microelectronic devices, and more particularly, to methods of varying the concentration of additives in CMP compositions to vary the coefficient of friction and/or selectivity of the CMP compositions for said devices during the polishing process.

DESCRIPTION OF THE RELATED ART

Different types of materials are employed in semiconductor manufacturing as materials of construction for components of microelectronic device structures (e.g., interconnect wiring, contacts, electrodes, conductive vias, field emitter base layers, etc.) on wafer substrates. For example, copper is rapidly becoming the interconnect metal of choice in semiconductor manufacturing due to its higher conductivity and increased electromigration resistance relative to aluminum and aluminum alloys.

Typically, the process scheme for incorporating copper in semiconductor manufacturing involves the damascene approach, wherein features are etched in a dielectric material, filled with blanket metallization, and the surface metallization removed to isolate the features. In the dual damascene process, a single fill is used to form both plugs and lines. Since copper has a propensity to diffuse into the dielectric material, leading to leakage, barrier/liner layers such as Ta and/or TaN are often used to seal the copper interconnects and prevent detrimental Cu migration. Following deposition of the barrier layer material, a thin seed layer of copper is deposited on the liner material via physical or chemical vapor deposition, followed by electrodeposition of copper to fill the features.

As copper is deposited to fill the etched features, elevational disparity or topography develops across the surface of the layer, having raised and recessed regions. The deposited copper overburden must then be removed to electrically isolate the individual features of the circuitry and to render it of suitable form to accommodate subsequent process steps in the fabrication of the finished semiconductor product, and in order to satisfactorily operate in the micro-circuitry in which it is present. The planarization typically involves chemical mechanical polishing (CMP), using a CMP composition formulated for such purpose.

Chemical mechanical polishing or planarization is a process in which material is removed from a surface of a semiconductor wafer, and the surface is polished (planarized) by coupling a physical process such as abrasion with a chemical process such as oxidation or chelation. In its most rudimentary form, CMP involves applying slurry, specifically a solution of abrasives and active chemical agents, to a wafer surface or polishing pad that polishes the different materials on the surface structure of the semiconductor wafer to achieve both the removal of unwanted material and planarization of the wafer surface. It is not desirable for the removal or polishing process to be purely physical or purely chemical, but rather the synergistic combination of both is preferred in order to achieve fast, uniform removal and a planar surface of the materials of construction.

Due to the difference in chemical reactivity between copper and the barrier layer, e.g. Ta, TaN, etc., two chemically distinct slurries are often used in the copper CMP process. At least one copper removal slurry is used to rapidly planarize the topography and to uniformly remove the copper, with a copper removal polish stopping at or near the barrier layer. The barrier removal slurry removes the barrier layer material at a high removal rate and stops at or near the dielectric layer, or alternatively at a cap layer that has been applied to protect the dielectric.

Copper removal chemical mechanical polishing (CMP) compositions for planarization and polishing of copper typically are in the form of slurries containing an abrasive of suitable type, e.g., an abrasive selected from among silica, alumina, and other oxides and ceramic (non-metallic) materials, in a solvent medium containing one or more solvent species, e.g., water, organic solvents, etc. Typically, copper removal slurries have a high copper removal rate, and a copper to barrier material removal rate selectivity of greater than 100:1, e.g., about 100:1 to about 400:1. During copper removal, bulk copper is rapidly removed often followed by the "soft landing" or "touchdown," whereby the downforce of the polisher is reduced and/or the polishing composition altered until the underlying barrier material is exposed, as determinable using an endpoint detection system including, but not limited to, an optical, torque, or eddy current end point or any other system, as readily determinable by one skilled in the art. Although the endpoint has been detected, signaling the exposure of the barrier layer, copper overburden remains which must be removed and as such, an over-polishing step may be performed. Unfortunately, the "soft landing" and the over-polishing steps often result in dishing and/or erosion into copper features and thus, loss of wafer surface planarity and uniformity. Dishing occurs when the copper and barrier material removal rates are disparate and as such, too much copper is removed such that the copper surface in the feature is recessed relative to the barrier and/or dielectric surface of the microelectronic device wafer. Oxide erosion occurs when too much dielectric material is removed. In addition to mechanical adjustments, e.g., downforce, polishing formulations having the appropriate selectivity for the material(s) to be removed are important to obtaining uniform planarization across the wafer surface, i.e., minimal dishing and/or erosion.

Due to the different mechanical and chemical characteristics of copper and barrier layer materials, there is a need in the art for improved CMP compositions and processes for planarization of a wafer surface to balance removal rates while maintaining an acceptable topography of the planarized surface, especially during the "soft landing" and overpolishing steps.

SUMMARY OF THE INVENTION

The present invention relates to a chemical mechanical polishing process for the polishing of microelectronic device substrates, preferably devices having copper thereon. The invention broadly relates to CMP processing wherein a first CMP composition is used during a first CMP processing step and a second CMP composition comprising the first CMP composition and at least one additive is used during a second CMP processing step.

The present invention relates to a CMP process that includes the use of a first slurry formulation in a first CMP processing step followed by addition of an additive to the formulation during a second CMP processing step. It is recognized that the first and second CMP processing steps may correspond to the bulk material removal process and soft landing/overpolishing process, respectively. Alternatively, both the first and second CMP processing steps may be utilized to remove bulk material from the substrate.

One aspect of the invention relates to a CMP process that includes the use of a first slurry formulation in a bulk material removal CMP processing step with the subsequent addition of an additive to the formulation during the soft landing and overpolishing CMP processing steps.

Another aspect of the invention relates to a method of polishing the surface of a microelectronic device, said method comprising:
 (a) contacting said surface for sufficient time and under first chemical mechanical polishing (CMP) conditions with a first CMP composition; and
 (b) contacting said substrate under second CMP conditions with a second CMP composition, wherein the second CMP composition comprises a mixture of said first CMP composition and an additive.

Preferably, the additive comprises a species selected from the group consisting of deionized water, organic solvent, rheology agent, pH adjusting agent, passivating agent, frictive agent, and combinations thereof.

In one preferred embodiment, the invention relates to a method of polishing a microelectronic device substrate on a platen, said method comprising:
 (a) contacting the substrate for sufficient time and under first chemical mechanical polishing (CMP) conditions with a first CMP composition effective for planarizing and removing material from the substrate; and
 b) contacting the substrate on the same platen for sufficient time and under second CMP conditions with a second CMP composition comprising the first CMP composition modified by an in-situ addition of at least one additive selected from the group consisting of organic solvent, pH adjusting agent, rheology agent, chelating agent, passivating agent, frictive agent, and combinations thereof.

Preferably, said second CMP composition is effective for removing material overburden and exposing a barrier material layer, and wherein the second CMP composition has a material static etch rate less than that of the first CMP composition.

Preferably, the material comprises copper.

In yet another aspect, the present invention relates to a method of manufacturing a microelectronic device, said method comprising contacting a microelectronic device substrate having material to be planarized thereon for sufficient time and under first chemical mechanical polishing (CMP) conditions with a first CMP composition effective for planarizing the material and contacting said material on the substrate for sufficient time and under second CMP conditions with a second CMP composition effective for removing material overburden and exposing a barrier material layer, wherein the second CMP composition comprises a mixture of said first CMP composition and at least one additive. Yet another aspect of the present invention relates to a method of manufacturing a microelectronic device, said method comprising: (a) performing a first CMP processing step on a microelectronic device substrate using a first CMP composition, (b) a second CMP processing step on said microelectronic device substrate using a second CMP composition, said second CMP composition comprising said first CMP composition and at least one additive; and (c) subsequently processing said substrate to form a microelectronic device.

Yet another aspect of the invention relates to improved microelectronic devices, and products incorporating same, made using the methods and/or compositions described herein.

Another aspect of the invention relates to a composition for the planarization of metal-containing films, said composition comprising oxidizing agent, inhibiting agent, abrasive, solvent, and CMP residue, wherein said CMP residue preferably comprises metal of the metal-containing films. In a preferred embodiment, this aspect of the invention relates to a composition for the planarization of copper films, said composition comprising oxidizing agent, inhibiting agent, abrasive, solvent, and copper CMP residue.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
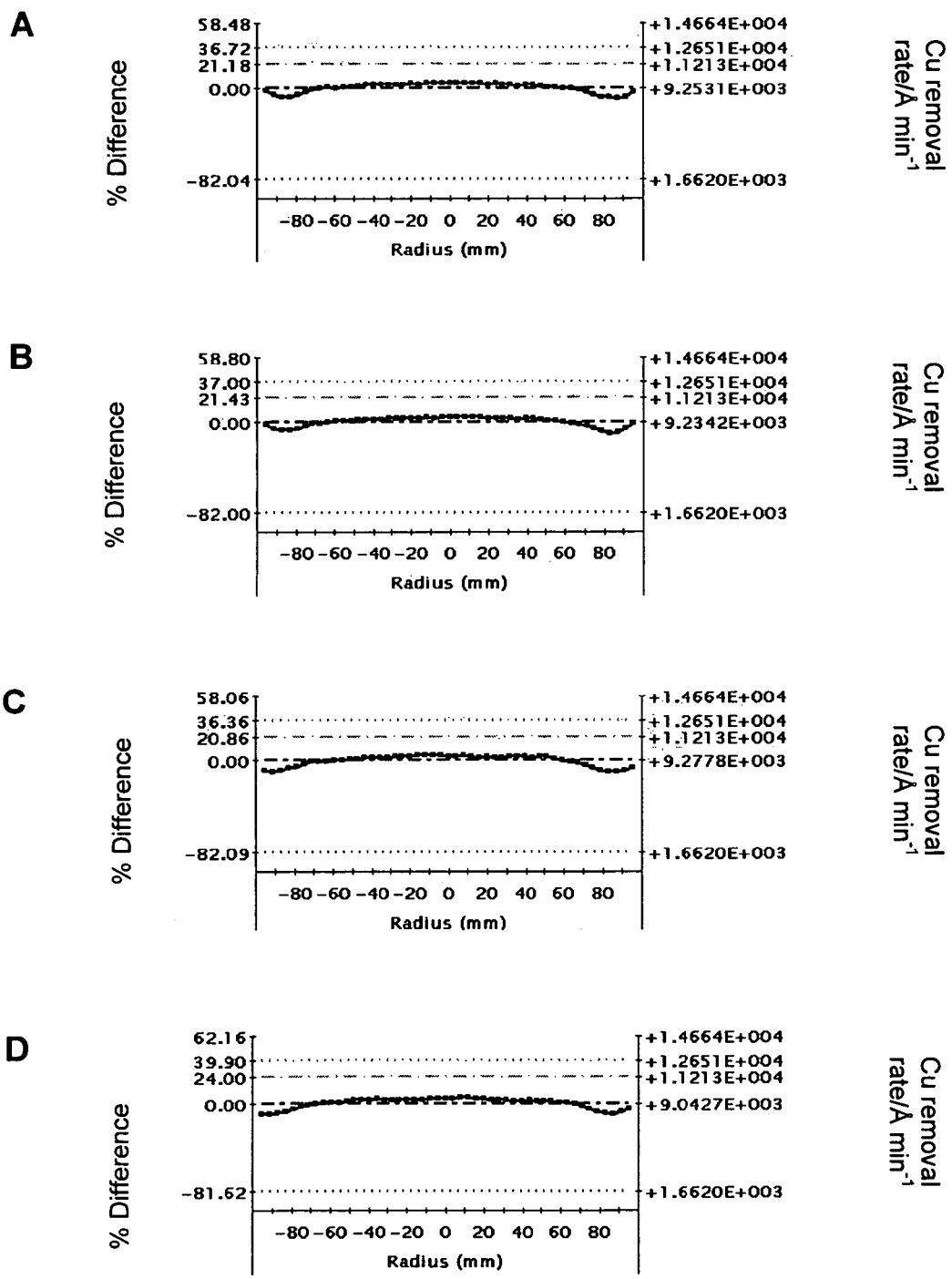
FIGS. 1A-1D illustrate the copper removal rate in $\text{Å min}^{-1}$ and the percent difference relative to the average copper removal rate, at points along a bisecting line of the microelectronic device wafer, for bulk copper removal at a formulation flow rate of 200 mL min$^{-1}$ (FIG. 1A), 150 mL min$^{-1}$ (FIGS. 1B and 1C) and 100 mL min$^{-1}$ (FIG. 1D).

The present invention relates to improved chemical mechanical polishing slurries and processes. One preferred embodiment relates to a CMP process that provides a high copper removal rate, a comparatively low liner material removal rate, appropriate material selectivity ranges to minimize copper dishing at the onset of barrier exposure, and good planarization efficiency.

"Soft landing" or "touchdown," as defined herein, corresponds to some point in the conductive material or metal removal polishing process whereby the downforce of the polisher may be decreased and/or an agent is introduced to reduce dishing and/or erosion of the conductive material or metal, e.g., copper. Preferably, soft landing may be effectuated when the thickness of the layer of conductive material or metal over the barrier material has been decreased to a range of from about 0.5 µm to about 0.05 µm.

As used herein, "about" is intended to correspond to ±5% of the stated value.

"Microelectronic device," as used herein, corresponds to semiconductor substrates, microelectronic packaging, memory devices, flat panel displays, and microelectromechanical systems (MEMS). It is to be understood that the term "microelectronic device" is not meant to be limiting in any way and includes any substrate that will eventually become a microelectronic device.

As defined herein, "barrier layer material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, tungsten, and other refractory metals and their nitrides and silicides. Specific reference to tantalum hereinafter in the broad description of the invention is meant to provide an illustrative example of the present invention and is not meant to limit same in any way. In a particularly preferred embodiment, the barrier layer material is substantially devoid of tungsten. As defined herein, "substantially devoid" corresponds to less than about 0.5 wt. %, more preferably less than 0.05 wt. %, and most preferably less than 0.005 wt. % of the composition, based on the total weight of said barrier layer material.

"Over-polishing" is performed subsequent to soft landing to remove copper residue(s) from the surface of the barrier material, while minimizing additional dishing or erosion of the copper features.

As used herein, "suitability" to planarize bulk copper and remove copper overburden from a microelectronic device having said copper thereon corresponds to at least partial removal of said copper from the microelectronic device. Preferably, at least 90% of the copper, more preferably at least 95% of the copper, and most preferably at least 99% of the copper is removed from the microelectronic device using the compositions of the invention.

As used herein, dilution of the CMP composition "subsequent" to the planarization of bulk copper corresponds to immediately before the soft landing step, during the soft landing step and/or during the over-polishing step.

As used herein, within wafer non-uniformity (WIWNU) corresponds to a measurement of variation of material removal across the wafer. More specifically, WIWNU is the percent standard deviation of the amount of Cu removed for 49 measurement points, based on the average amount of Cu removed for said 49 measurement points, relative to the average amount of Cu removed for the 49 measurement points. Preferably, the WIWNU is less than about 5%.

Importantly, the present invention is not limited to use with copper-containing layers. It is contemplated that the process described herein may be used to uniformly planarize other layers on the microelectronic device wafer surface including, but not limited to, tungsten, aluminum, silver, gold, platinum, tantalum, tantalum nitride, tantalum silicon nitride, suicides, titanium, titanium nitride, ruthenium, palladium, hafnium, TEOS, USG, FSG, BPSG, PSG, OSG, silicon nitride, other low-k dielectrics, permalloy, aluminum oxide, etc. Any situation where the CMP process is planarizing a blanketed or patterned layer would potentially benefit from the approach. It is to be understood that reference to copper hereinafter is not meant to be limiting in any way.

In CMP, slurries are formulated to independently control the relative polishing rates between the different materials of the pattern to be polished. For example, the copper removal slurry is used to rapidly remove bulk copper and to uniformly planarize the topography. The barrier layer removal slurry is used to remove the barrier layer material down to the dielectric layer, or alternatively to stop on or remove a cap layer that has been applied to protect the dielectric. Sometimes, two slurries are used during copper removal, one to remove the bulk copper at platen 1, and one to prevent dishing and erosion of the copper during "soft landing" and over-polishing at platen 2. The use of two slurry formulations for copper removal processing may be disadvantageous for some applications because of the increased solution cost, storage and disposal requirements.

The present inventors previously described a CMP slurry formulation that could be utilized during both bulk copper removal and soft-landing and overpolishing, wherein the CMP slurry composition included rheology agents (see co-pending U.S. patent application Ser. No. 10/436,381 filed May 12, 2003 in the name of Karl Boggs et al., now U.S. Pat. No. 7,736,405 issued on Jun. 15, 2010, which is incorporated herein by reference in its entirety). The rheology agent was included in the CMP slurry to modify the viscosity and fluid flow of the CMP slurry, which is critical for dishing and erosion control during soft-landing and overpolishing, however the rheology agent also reduced the rate of bulk copper removal during bulk copper removal.

Knowing this, one embodiment of the present invention relates to a process of using CMP formulations to efficiently and uniformly planarize copper-containing microelectronic device wafer surfaces. The process comprises the use of a bulk copper removal CMP formulation to effectuate the bulk copper removal followed by the use of a soft landing or touchdown composition to remove the copper overburden. In a particularly preferred embodiment, bulk copper removal and soft landing and overpolish occur at the same platen. The soft landing or touchdown composition will be described at length hereinafter.

The bulk copper removal CMP formulation preferably includes at least one oxidizing agent, at least one passivating agent, at least one abrasive, optionally at least one chelating agent, and optionally at least one frictive agent. The bulk copper removal CMP formulation is preferably substantially devoid of rheology agent, persulfate and phosphoric acid.

In the broad practice of the invention, the bulk copper removal CMP formulation may comprise, consist of, or consist essentially of at least one oxidizing agent, at least one passivating agent, at least one abrasive, optionally at least one chelating agent, and optionally at least one frictive agent. In general, the specific proportions and amounts of oxidizing agent(s), passivating agent(s), abrasive(s), optional chelating agent(s), and optional frictive agent(s), in relation to each other, may be suitably varied to provide the desired removal action of the bulk copper layer from the microelectronic device substrate having same thereon, as readily determinable within the skill of the art without undue effort.

The abrasive component of the bulk copper removal composition as used herein may be of any suitable type, including, without limitation, oxides, metal oxides, silicon nitrides, carbides, etc. Specific examples include silica, alumina, silicon carbide, silicon nitride, iron oxide, ceria, zirconium oxide, tin oxide, titanium dioxide, and mixtures of two or more of such components in suitable form, such as grains, granules, particles, or other divided form. Alternatively, the abrasive can include composite particles formed of two or more materials, e.g., NYACOL® alumina-coated colloidal silica (Nyacol Nano Technologies, Inc., Ashland, Mass.). Alumina is a preferred inorganic abrasive and can be employed in the form of boehmite or transitional δ, θ or γ phase alumina. Organic polymer particles, e.g., including thermoset and/or thermoplastic resin(s), can be utilized as abrasives. Useful resins in the broad practice of the present invention include epoxies, urethanes, polyesters, polyamides, polycarbonates, polyolefins, polyvinylchloride, polystyrenes, polyolefins, and (meth) acrylics. Mixtures of two or more organic polymer particles can be used as the abrasive medium, as well as particles comprising both inorganic and organic components including coated and doped particles. Preferably, the abrasives are selected or modified to be compatible with acidic media. In a preferred embodiment, the abrasive component of the present invention includes alumina-coated colloidal silica. In a particularly preferred embodiment, the abrasive material has a Knoop scale hardness less than 1000, more preferably less than 800.

The oxidizing agent of the bulk copper removal composition includes any substance which removes metal electrons and raises the atomic valence and includes, but is not limited to, hydrogen peroxide ($H_2O_2$), ferric nitrate ($Fe(NO_3)_3$), potassium iodate ($KIO_3$), potassium permanganate ($KMnO_4$), nitric acid ($HNO_3$), ammonium chlorite ($NH_4ClO_2$), ammonium chlorate ($NH_4ClO_3$), ammonium iodate ($NH_4IO_3$), ammonium perborate ($NH_4BO_3$), ammonium perchlorate ($NH_4ClO_4$), ammonium periodate ($NH_4IO_3$), ammonium persulfate ($(NH_4)_2S_2O_8$), tetramethylammonium chlorite ($(N(CH_3)_4)ClO_2$), tetramethylammonium chlorate ($(N(CH_3)_4)ClO_3$), tetramethylammonium iodate ($(N(CH_3)_4)IO_3$), tetramethylammonium perborate ($(N(CH_3)_4)BO_3$), tetramethylammonium perchlorate ($(N(CH_3)_4)ClO_4$), tetramethylammonium periodate ($(N(CH_3)_4)IO_4$), tetramethylammonium persulfate ($(N(CH_3)_4)S_2O_8$), urea hydrogen peroxide ($(CO(NH_2)_2)H_2O_2$), and combinations thereof. The preferred oxidizing agent for the bulk copper removal composition of the invention is hydrogen peroxide.

Alternatively, the oxidizing agent may comprise an amine-N-oxide having the formula ($R^1R^2R^3N \rightarrow O$), wherein $R^1R^2R^3$ are independently selected from the group consisting of: H and $C_1$-$C_8$ alkyl. Specific examples of amine-N-oxides include but are not limited to 4-methylmorpholine N-oxide ($C_5H_{11}NO_2$), trimethylamine-N-oxide, triethylamine-N-oxide, N-ethylmorpholine-N-oxide, N-methylpyrrolidine-N-oxide, and N-ethylpyrrolidine-N-oxide, pyridine-N-oxide ($C_5H_5NO$), and combinations thereof.

The term chelating agent as used in the present bulk copper removal composition is intended to mean any substance that in the presence of a water-containing solution solubilizes or etches the oxidized copper material. Copper chelating agents and/or etchants useful in the present invention include but are not limited to inorganic acids and organic acids, amines and amino acids (e.g., alanine, citric acid, acetic acid, maleic acid, oxalic acid, malonic acid, succinic acid, nitrilotriacetic acid, iminodiacetic acid, ethylenediamine, and EDTA), and combinations thereof. It should be appreciated that if a different material is planarized, the chelating agent should favorably chelate said material and/or ions thereof.

The term passivating agent as used herein, is intended to mean any substance that reacts with the fresh copper surface and/or oxidized copper thin film to passivate the copper layer and prevent excessive etching of the copper surface during CMP. Preferably, the passivating agent component in the bulk copper removal composition of the invention may comprise one or more inhibitor components, for example, triazoles, such as 1,2,4-triazole (TAZ), triazoles substituted with substituents such as $C_1$-$C_8$ alkyl, amino, thiol, mercapto, imino, carboxy and nitro groups, such as benzotriazole, tolyltriazole, 5-phenyl-benzotriazole, 5-nitro-benzotriazole, 3-amino-5-mercapto-1,2,4-triazole, 1-amino-1,2,4-triazole, hydroxy-benzotriazole, 2-(5-amino-pentyl)-benzotriazole, 1-amino-1, 2,3-triazole, 1-amino-5-methyl-1,2,3-triazole, 3-amino-1,2, 4-triazole, 3-mercapto-1,2,4-triazole, 3-isopropyl-1,2,4-triazole, 5-phenylthio-benzotriazole, halo-benzotriazoles (halo=F, Cl, Br or I), naphthotriazole, and the like, as well as thiazoles, tetrazoles, imidazoles, phosphates, thiols and azines such as 2-mercaptobenzimidazole (MBI), 2-mercaptobenzothiazole, 4-methyl-2-phenylimidazole, 2-mercaptothiazoline, 5-aminotetrazole, 5-amino-1,3,4-thiadiazole-2-thiol, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, mercaptobenzimidazole, 4-methyl-4H-1,2,4-triazole-3-thiol, 5-amino-1,3,4-thiadiazole-2-thiol, benzothiazole, tritolyl phosphate, imidazole, indazole, and combinations thereof. Dicarboxylic acids such as oxalic acid, malonic acid, succinic acid, nitrilotriacetic acid, iminodiacetic acid, and combinations thereof are also useful passivating agents. Importantly, the ratio of triazole compound to benzotriazole compound in the copper removal CMP formulation is most preferably less than 1:1 or greater than 100:1. In a specific embodiment, the passivating agent is 5-aminotetrazole (ATA). It should be appreciated that if a different material is planarized, the passivating agent should favorably passivate said material.

The solvents employed in the bulk copper removal composition and the soft-landing and overpolishing compositions of the invention can be single component solvents or multi-component solvents, depending on the specific application. In one embodiment of the invention, the solvent in the bulk copper removal CMP formulation is water. In another embodiment, the solvent comprises an organic solvent, e.g., methanol, ethanol, propanol, butanol, ethylene glycol, propylene glycol, glycerin, etc. In yet another embodiment, the solvent comprises a water-alcohol solution. A wide variety of solvent types and specific solvent media can be employed in the general practice of the invention to provide a solvating/suspending medium in which the abrasive is dispersed and in which the other components are incorporated to provide a composition of appropriate character, e.g., of slurry form, for application to the platen of the CMP unit to provide a desired level of polishing of the copper on the wafer substrate. Preferably, the same solvent is used in the bulk copper removal CMP formulation and the soft-landing and overpolishing compositions. The amount of solvent present in the removal compositions of the invention, is in a range from about 0.01 wt. % to about 99.9 wt. %, preferably about 90 wt. % to about 99.88 wt. %, based on the total weight of the composition.

Bases can be optionally employed for pH adjustment in compositions of the invention. Illustrative bases include, by way of example, potassium hydroxide, ammonium hydroxide and tetramethylammonium hydroxide (TMAH), tetraethylammonium hydroxide, trimethyl hydroxyethylammonium hydroxide, methyl tri (hydroxyethyl) ammonium hydroxide, tetra(hydroxyethyl)ammonium hydroxide, and benzyl trimethylammonium hydroxide. Preferably, the base is KOH.

Preferably, the frictive agent is present in the bulk copper removal CMP formulation and is compatible and stable when combined with the components used in the bulk copper removal CMP formulation. More preferably, the frictive agent modifies, by increasing or decreasing, the coefficient of friction of the solution relative to specific materials on the exposed planarizable surface. Frictive agents contemplated include glycine, alanine, aspartic acid, asparagine, histadine, leucine, glutamic acid, serine, valine, and proline. In a particularly preferred embodiment, the frictive agent comprises glycine.

The bulk copper removal CMP formulation useful for bulk copper removal has the following composition ranges by weight, based on the total weight of the composition:

| | |
|---|---|
| oxidizing agent | about 0.1 to about 30 wt. %; |
| passivating agent | about 0.01 to about 10 wt. %; |
| frictive agent | 0 to about 10 wt. % |
| chelating agent | 0 to about 10 wt. %; and |
| abrasive | about 0.01 to about 30 wt. %. |

Preferably, when frictive agent is present in the formulation, at least 0.1 wt. % is present. When chelating agent is present in the formulation, at least 0.1 wt. % is present.

In a preferred embodiment, the bulk copper removal CMP formulation includes hydrogen peroxide, ATA, alumina-coated colloidal silica, and glycine as the frictive agent, wherein glycine is included in an amount that increases the coefficient of friction of the solution at a preferred pressure, temperature and mechanical movement of the polishing device. In another preferred embodiment, the bulk copper removal CMP formulation includes at least one oxidizing agent, at least one passivating agent, at least one abrasive, copper residue and/or copper ions, optionally at least one chelating agent, and optionally at least one frictive agent. It should be appreciated that if a material other than copper is planarized, the bulk copper removal CMP formulation may include residue or said material and/or ions thereof instead of, or in addition to, copper residue and/or copper ions.

Following rapid removal of the bulk copper layer, which coincides with the aforementioned soft landing, (a) a rheology agent-containing solution may be introduced to the bulk copper removal CMP composition for soft landing and over-polishing at the same or a different platen, or (b) the bulk copper removal CMP formulation may be diluted in situ with at least one "additive" selected from the group consisting of deionized water, polar solvent, pH adjusting agent, rheology agent, chelating agent, passivating agent, frictive agent, polymeric additive and combinations thereof, either by in-line mixing or directly to the platen, to form the soft-landing and overpolishing composition for the soft landing and over-polishing steps, wherein the bulk copper removal and the soft landing and overpolishing steps are effectuated at the same or a different platen.

Addition of the rheology agent-containing solution to the bulk copper removal CMP formulation provides a means of modifying the slurry's viscosity and fluid flow, which encompasses the movement of one layer of the slurry past another, with a reduced interaction of the particles with the wafer surface. Accordingly, the soft-landing and overpolishing composition, including rheology agent, may be used to control dishing and erosion phenomena during planarization of sub-micron features. A more thorough discussion on the benefits of including a rheology agent in a CMP slurry composition is provided in the aforementioned co-pending U.S. patent application Ser. No. 10/436,381, now U.S. Pat. No. 7,736,405.

Preferably, the rheology agent used in the present invention is compatible and stable when combined with the components in the bulk copper removal slurry. Moreover, the rheology agent should be stable in a particular pH range and with a particular oxidizer. Preferred rheology agents are soluble in the active slurry components and non-reactive with the wafer surface chemistry.

Useful rheology agents include but are not limited to cross-linked acrylic polymers and Water Soluble Polymers (WSPs). More particularly, useful rheology agents include Noveon's Carbopol® series of polymers (Cleveland Ohio), modified cellulose derivatives, cellulose ethers, starch derivatives, pectin derivatives, and other polysaccharides, proteins and other natural polymers, polyacrylamides, water soluble polymers, polyelectrolytes, surfactants, and combinations thereof. In a preferred embodiment, the rheology agent most useful in the present invention is selected from the group consisting of hydroxypropylcellulose, hydroxyethylcellulose, carboxymethylcellulose, and combinations thereof.

In the soft-landing and overpolishing composition, the rheology agent increases the viscosity, and structures its flow such that vertical fluid motion is reduced. In a preferred embodiment, the rheology agent used in the present invention is hydroxypropylcellulose (HPC), having a molecular weight of in the range of 1,000 to 1,000,000 MW. Specific reference to HPC hereinafter in the broad description of the invention is meant to provide an illustrative example of the present invention and is not meant to limit same in any way.

In a preferred embodiment, the soft-landing and overpolishing composition includes the bulk copper removal CMP formulation and further includes 0.001 to 10% rheology agent by weight, based on the total weight of the composition. Preferably, the rheology agent includes HPC.

Accordingly, a rheology agent may be introduced to the bulk copper removal CMP formulation, at the point of use (e.g., mixing at the polishing table, polishing belt or the like), in an appropriate container shortly before reaching the polishing table, or by mixing in-line, to form the soft-landing and overpolishing composition for use at the same or a different platen. The ratio of bulk copper removal CMP formulation to rheology agent (or diluting agent) is chosen to target a process specific concentration of components. The range of ratios is only constrained by solubility limitations. For our processing experience this ratio is preferably in a range from about 1:1 to 10000:1, and in the case of the rheology agent, more preferably about 500:1 to about 1500:1 bulk copper removal CMP formulation to rheology agent.

The water soluble polymeric additive preferably has available sites for hydrogen bonding, including carbonyls, alcohols, thiols, amines, etc., and as such do not cause particle flocculation or aggregation, i.e., the water soluble polymeric additive acts as an anti-flocculating agent. As defined herein, "anti-flocculating agent," also known as a deflocculant, minimizes flocculation of the solid components of the composition. Flocculation processes including, but not limited to, depletion flocculation (entropy driven), electrostatic flocculation, capillary flocculation (the free energy of the particles is lower when the particles are in contact than when they are isolated in solution), other processes whereby interactive forces between the particles lead to aggregation, and combinations thereof, are preferably minimized using the anti-flocculating agent of the invention. In a preferred embodiment, the polymeric additive in copper removal CMP composition includes polyvinylpyrrolidone (PVP); any polymer made using the N-vinyl pyrrolidone monomer; polyacrylic acid esters and analogoues of polyacrylic acid esters; polyaminoacids such as polyalanine, polyleucine, polyglycine, etc.; polyamidohydroxyurethanes; polylactones; polyacrylamides; and combinations thereof. Preferably, the molecular weight of the polymeric additive is in a range from about 200 MW to about 500,000 MW, more preferably about 500 MW to about 100,000 MW, even more preferably about 1,000 MW to about 10,000 MW, and most preferably about 1,000 MW to about 5,000 MW, where MW corresponds to molecular weight in grams per mole. Preferably, the polymeric additive(s) do not substantially deposit on the surface of the microelectronic device.

In another embodiment the CMP slurry composition may be diluted in situ at platen 1 and/or at the second platen during the bulk copper removal, soft landing and/or over polishing step of the CMP process, either by in-line mixing, directly at the platen, or in an appropriate container shortly before reaching the polishing table. To limit the overly aggressive bulk copper removal CMP formulation during the bulk copper removal, soft landing and/or overpolishing steps, the bulk copper removal CMP formulation of the invention may be diluted in a single dilution, continuously or in a serial fashion. The diluting media may include an additive, including deionized water, polar solvent, pH adjusting agent, rheology agent, chelating agent, passivating agent, frictive agent, and combinations thereof, and introduced in an amount to reduce the speed of copper removal and also reduce dishing of the surface. The type and number of dilutions depends on the desired end result of the polish and may vary from one step-wise dilution to ten or more step-wise dilutions. Alternatively, the dilution may be effectuated in a continuous manner whereby additive is continuously added to the bulk copper removal CMP formulation during the bulk copper removal, soft-landing and/or over-polishing steps. In yet another alternative, the slurry is not diluted per se, but rather new diluted bulk copper removal CMP formulations are prepared for delivery of clean, diluted chemistries to the tool subsequent to the polish using the previous slurry.

The pH of the bulk copper removal CMP formulation and the soft-landing and overpolishing compositions may be the same as or different from one another and at any suitable value that is efficacious for the specific polishing operation employed. In one embodiment, the pH of the compositions can be in a range of from about 2 to about 11, more preferably in a range of from about 2 to about 7, and most preferably in a range of from about 3 to about 6. pH adjusting agents contemplated herein include: the aforementioned bases; acids such as acetic acid, and sulfuric acid; buffering species selected from the group consisting of potassium hydrogen phthalate, ammonium acetate, ammonium oxalate, ammonium carbamate, ammonium phosphate, ammonium hydrogen phosphate, ammonium dihydrogen phosphate, dibasic ammonium citrate, tribasic ammonium citrate; and mixtures thereof.

In addition, the bulk copper removal CMP formulation and the soft-landing and overpolishing compositions may further comprise additional components including, but not limited to defoamers, biocides, acids, amines, and surfactants. The bulk copper removal compositions of the invention may be readily formulated in a so-called "day tank" or "storage tank."

The bulk copper removal CMP formulation may be provided as a two-part formulation or a multi-part formulation or kit that may be mixed at the point of use or in a storage tank upstream of the tool. The advantage of a multi-part formulation resides in its extended shelf life, relative to single-package formulations. A single package formulation is more susceptible to decomposition and change of its properties over time, in part due to the presence of oxidizing agent, in relation to a multi-part formulation. The individual parts of the multi-part formulation can be mixed at the polishing table, polishing belt or the like, in the storage tank, or in an appropriate container shortly before reaching the polishing table. The concentrations of the respective ingredients can be widely varied in specific formulations of the bulk copper removal CMP formulation, in the practice of the invention, and it will be appreciated that the bulk copper removal CMP formulation of the invention can variously and alternatively comprise, consist or consist essentially of any combination of ingredients consistent with the disclosure herein.

The CMP formulations of the present invention may be delivered from a single package to the polishing table for use in a CMP process. Alternatively, each single ingredient of the CMP formulation may be individually delivered to the polishing table for combination at or before the table, to constitute the CMP formulation for use. In a preferred embodiment, the CMP formulation is formulated as a multi-part formulation in which a number of components of the CMP formulation are in a first container, a number of components of the CMP formulation are in a second container, etc., for combination at or before the tool, optionally with components provided by the user, to constitute the CMP formulation for use. For example, the bulk copper removal CMP formulation is formulated as a two-part formulation in which the first part comprises abrasive, passivating agent, optional frictive agent, and optional chelating agent in the appropriate solvent, and the second part comprises oxidizing agent. The multi-part formulation embodiments disclosed herein are not meant to be limiting in any way and may include alternative combinations. The mixing of ingredients or parts to form the final formulation may occur at the point of use (e.g., mixing at the polishing table, polishing belt or the like), in-line or in an appropriate mixing/contacting zone, region, area, chamber, container or the like preceding the point of use or shortly before reaching the polishing table, or at the CMP formulation manufacturer and/or supplier.

In yet another embodiment, the individual parts of the formulations described herein may be provided at concentrations at least three to four times greater than preferred during polishing. Accordingly, the concentrated formulation parts may be diluted with the appropriate solvent at the point of use (e.g., mixing at the polishing table, polishing belt or the like), in-line, or in an appropriate mixing/contacting zone, region, area, chamber, container or the like preceding the point of use or shortly before reaching the polishing table. For example, concentrated formulations comprising the components described herein may be diluted in a range from about 0.1:1 to about 4:1, preferably about 1:1 to about 3:1, with a solvent to form any of the preferred compositions described herein. Preferably, the diluting solvent comprises the solvent of the specific CMP slurry composition.

Accordingly, another aspect of the invention relates to a kit including, in one or more containers, the components adapted to form the formulations of the invention as described hereinabove. One preferred kit includes, in one or more containers, an oxidizing agent, passivating agent, abrasive, frictive agent, and additive (e.g., rheology additive). Another preferred kit includes a first container including a passivating agent and abrasive, a second container including an oxidizing agent, a third container including a frictive agent, and a fourth container including additive (e.g., rheology additive). Still another kit includes a first container including, but not limited to, an abrasive, passivating agent, and frictive agent, and a second container including, but not limited to, an additive, wherein the first and second containers are combined with at least one oxidizing agent and solvent at or before the point of use. The containers of the kit must be suitable for storing and shipping said removal composition components, for example, NOWPak® containers (Advanced Technology Materials, Inc., Danbury, Conn., USA). The one or more containers which contain the components of the removal composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended removal composition to a process tool. The solution to be stored in NOWPak® or similar containers may optionally be degassed or purged with an inert gas in order to reduce oxidative corrosion of polysilicon and other potentially sensitive materials.

Substantially chemically inert, impurity-free, flexible and resilient polymeric film materials, such as high density polyethylene, are preferably used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020 inch).

Regarding the containers for the kits of the invention and systems for delivering same to the table, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" and U.S. Provisional Patent Application No. 60/916,966 entitled "SYSTEMS AND METHODS FOR MATERIAL BLENDING AND DISTRIBUTION" filed on May 9, 2007 in the name of John E.Q. Hughes.

In practice, the bulk copper removal CMP formulation is delivered to a platen, e.g., platen 1, for bulk copper removal. The processing conditions of bulk copper removal include a platen downforce in a range from about 1 psi to about 7 psi, preferably about 3 psi. The process time of bulk copper removal is related to downforce; lower downforce results in longer process times. Process times and conditions are readily determinable by one skilled in the art. The bulk copper removal formulation may be delivered to the platen at flow rate in a range from about 10 mL min$^{-1}$ to about 10 L min$^{-1}$, preferably in a range from about 120 mL min$^{-1}$ to about 220 mL min$^{-1}$, more preferably in a range from about 140 mL min$^{-1}$ to about 200 mL min$^{-1}$, most preferably in a range from about 150 mL min$^{-1}$ to about 180 mL min$^{-1}$. The flow rates are scaled with the polishing tool design, e.g., platen size and the number of wafers per platen. Preferably, using the present invention, the copper removal rate during bulk copper removal at 3 psi is in a range from about 6,000 Åmin$^{-1}$ to about 15,000 Åmin$^{-1}$, most preferably in a range from about 9,000 Åmin$^{-1}$ to about 11,000 Åmin$^{-1}$.

When present, the frictive agent-containing solution may be introduced directly to the site of use concurrently with the bulk copper removal CMP formulation. The ratio of bulk copper removal CMP formulation to frictive agent is chosen to target a process specific concentration of components which in turn will provide for a specific coefficient of friction and predetermined modified removal rate. The range of ratios is only constrained by solubility limitations. The ratio is preferably in a range from about 1:1 to 20:1, more preferably about 2.5:1 to about 5:1, most preferably about 3:1 to about 4:1.

It is noted that the bulk copper removal CMP formulation and the frictive agent may be mixed together by other means as readily determinable by one skilled in the art. For example, the solutions may be mixed in a dynamic or static mixing chamber positioned upstream of the platen.

Following completion of bulk copper removal at the platen, the wafer may be transferred to another platen, e.g., platen 2, for soft landing and over-polishing using a soft-landing and overpolishing formulation as described herein, i.e., diluted with rheology agent and/or other additive. Alternatively, the bulk copper removal CMP formulation may be diluted in situ at platen 1 with rheology agent and/or other additive. The processing conditions and time of soft-landing and overpolishing is dependent on the measurable endpoint. The endpoint is readily determined by one skilled in the art, e.g., using a technique such as optical, torque, eddy current, etc. Upon reaching the endpoint, the soft landing polishing is preferably ceased and over-polishing begins. Over-polishing is performed to remove the copper residuals from the surface of the barrier material, while minimizing additional dishing or erosion of the copper features.

The processing conditions and time of soft-landing and overpolishing is dependent on the measurable endpoint. The endpoint is readily determined by one skilled in the art, e.g., using a technique such as optical, torque, friction, eddy current, etc. Upon reaching the endpoint, the soft landing polishing is preferably ceased and over-polishing begins (preferably at the same platen using the soft-landing and overpolishing formulation). Over-polishing is performed to remove the copper residuals from the surface of the barrier material, while minimizing additional dishing or erosion of the copper features.

The processing conditions of soft-landing and overpolishing include a platen downforce in a range from about 0.1 psi to about 4 psi, preferably in a range from about 1 psi to about 2 psi. In a preferred embodiment, the platen downforce may be greater during soft landing polishing than during overpolishing, e.g., about 2 psi during soft landing and about 1 psi during over-polishing. The process time of the soft landing and the over polish is readily determinable by one skilled in the art.

It should be appreciated by those skilled in the art that the rate of copper removal during soft-landing and overpolishing will be lower than the rate of copper removal during bulk copper removal. Preferably, the rate of copper removal during the soft landing is less than 5000 $\text{Åmin}^{-1}$, more preferably less than 2000 $\text{Åmin}^{-1}$.

Following completion of the copper removal CMP process, the platen and microelectronic device substrate may be rinsed with a solvent such as water or a pad cleaning agent. Preferably, the solvent is the same as that used in the copper removal CMP formulations described herein, e.g., water. The pad cleaning chemistry is preferably a solution of a carboxylic acid and its ammonium salt, such as the commercial product LP-12 (ATMI, Danbury, Conn., USA), more preferably, a 10:1 dilution (with water) of LP-12. Thereafter, the microelectronic device substrate may be subjected to barrier removal polishing conditions.

Notably, the present invention provides for a method of monitoring and/or adjusting the concentration of a frictive agent in response to changes in temperature, humidity, platen pressure, speed of polishing device or proximity of different materials which require a change in concentration. For example, frictional force is measured in terms of the torque required to keep the carrier head moving at a constant velocity. Sensors such as strain gauges can be used to measure said frictional force in the presence of CMP slurries of the invention. If the torque must be adjusted then additional frictive agent may be added to the solution or in the alternative additional solvent or some diluting agent may be added to reestablish a useful frictional force.

Figure 3:
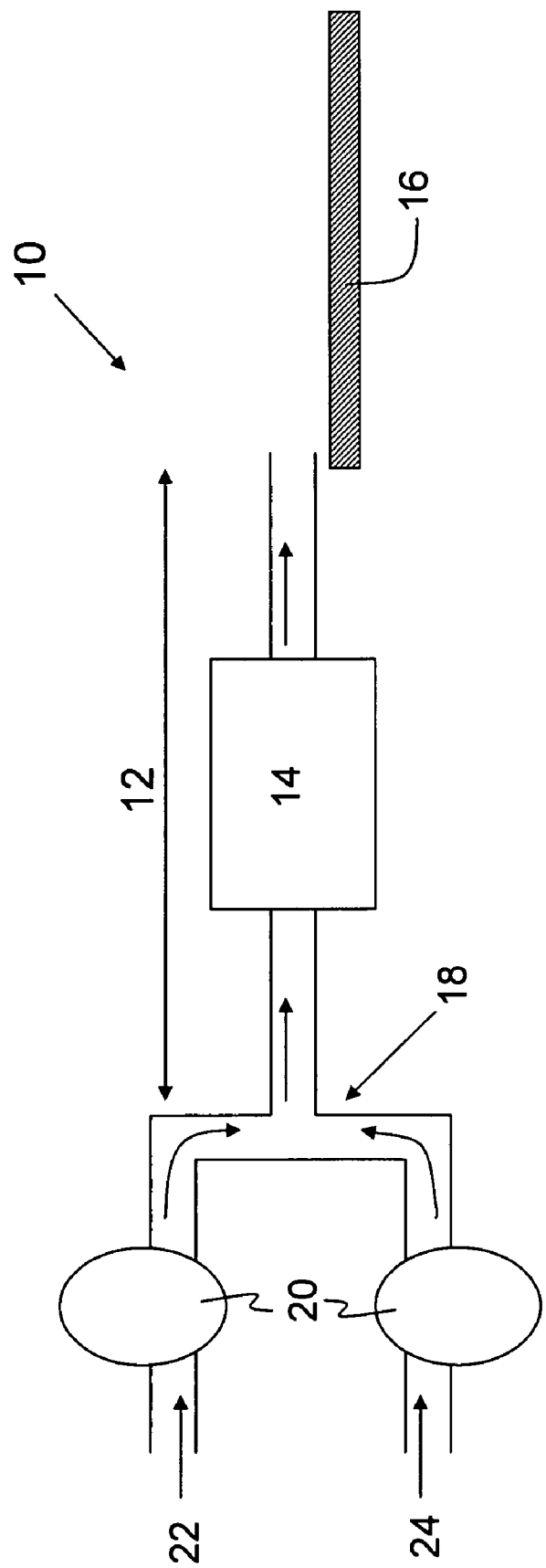
FIG. 3 is a schematic of an in-line CMP formulation mixing apparatus according to the present invention.

FIG. 3 illustrates an in-line mixing embodiment 10 which includes a t-connector 18 downstream of internal pumps 20, one pump 20 to move bulk copper removal formulation 22 from a 'storage tank' or a re-distribution system to the t-connector 18, and the other pump 20 to move the rheology agent-containing solution or diluting agent 24 from a container to the t-connector 18. Preferably, the pumps are tool pumps. Flow rates for the formulations are chosen so that the ratio of bulk copper removal CMP formulation to rheology agent-containing solution (or diluting agent) is preferably in a range from about 2:1 to 20:1, more preferably about 3:1 to about 5:1, most preferably about 3:1 to about 4:1. For example, the flow rate of bulk copper removal formulation to platen 2 may be in the range from about 120 mL/min to about 220 mL/min, preferably about 180 mL/min, while the flow rates for the rheology agent-containing solution may be in the range from about 30 mL/min to about 70 mL/min, preferably about 50 mL/min. The mixing of the soft-landing and overpolishing formulation is complete within about one meter of tubing 12 of the t-connector 18. A point-of-use (POU) filter 14 may be positioned downstream of the t-connector 18 to remove aggregates and other particulate matter prior to passage of the soft-landing and overpolishing formulation to the platen 16.

In another aspect, the present invention relates to an apparatus for polishing a microelectronic device substrate on a platen, said apparatus comprising:
  (a) means for contacting the substrate for sufficient time and under first chemical mechanical polishing (CMP) conditions with a first CMP composition effective for planarizing and removing material from the substrate; and
  b) means for contacting the substrate on the same platen for sufficient time and under second CMP conditions with a second CMP composition comprising the first CMP composition modified by an in-situ addition of at least one additive selected from the group consisting of organic solvent, pH adjusting agent, rheology agent, chelating agent, passivating agent, frictive agent, and combinations thereof.

Preferably, said second CMP composition is effective for removing material overburden and exposing a barrier material layer and the second CMP composition has a material static etch rate less than that of the first CMP composition.

In yet another aspect, the present invention relates to an apparatus for polishing a microelectronic device substrate on a platen, said apparatus comprising:
  (a) means for contacting the substrate on a first platen for sufficient time and under first chemical mechanical polishing (CMP) conditions with a first CMP composition effective for planarizing and removing material from the substrate; and
  b) means for contacting the substrate on a second platen for sufficient time and under second CMP conditions with a second CMP composition comprising the first CMP composition modified by an in-situ addition of at least one additive selected from the group consisting of organic solvent, pH adjusting agent, rheology agent, chelating agent, passivating agent, frictive agent, and combinations thereof.

Preferably, said second CMP composition is effective for removing material overburden and exposing a barrier material layer and the second CMP composition has a material static etch rate less than that of the first CMP composition.

The following Examples are merely illustrative of the invention and are not intended to be limiting.

Example 1

An experiment was performed to determine the optimum delivery flow rate of bulk copper removal formulation to platen 1 during bulk copper removal. Blanket wafers, having a silicon substrate, a dielectric layer, barrier layer, and a 15,000 Å copper layer, were processed using the bulk copper removal formulation on platen 1 of a Mirra tool. The downforce of the platen 1 was 3 psi. The results, including Cu removal rate and within wafer non-uniformity (WIWNU), are illustrated in FIG. 1 and summarized in Table 1 below.

TABLE 1

Bulk copper removal formulation flow rate versus copper removal rate and WIWNU.

| Bulk Cu removal formulation flow rate (mL min$^{-1}$) | Cu removal rate (RR) (Å min$^{-1}$) | WIWNU % | Figure |
|---|---|---|---|
| 200 | 9253 | 4.381% | 1A |
| 150 | 9234 | 4.202% | 1B |

TABLE 1-continued

Bulk copper removal formulation flow rate
versus copper removal rate and WIWNU.

| Bulk Cu removal formulation flow rate (mL min$^{-1}$) | Cu removal rate (RR) (Å min$^{-1}$) | WIWNU % | Figure |
|---|---|---|---|
| 150 | 9278 | 4.888% | 1C |
| 100 | 9043 | 4.643% | 1D |

Figure 2:
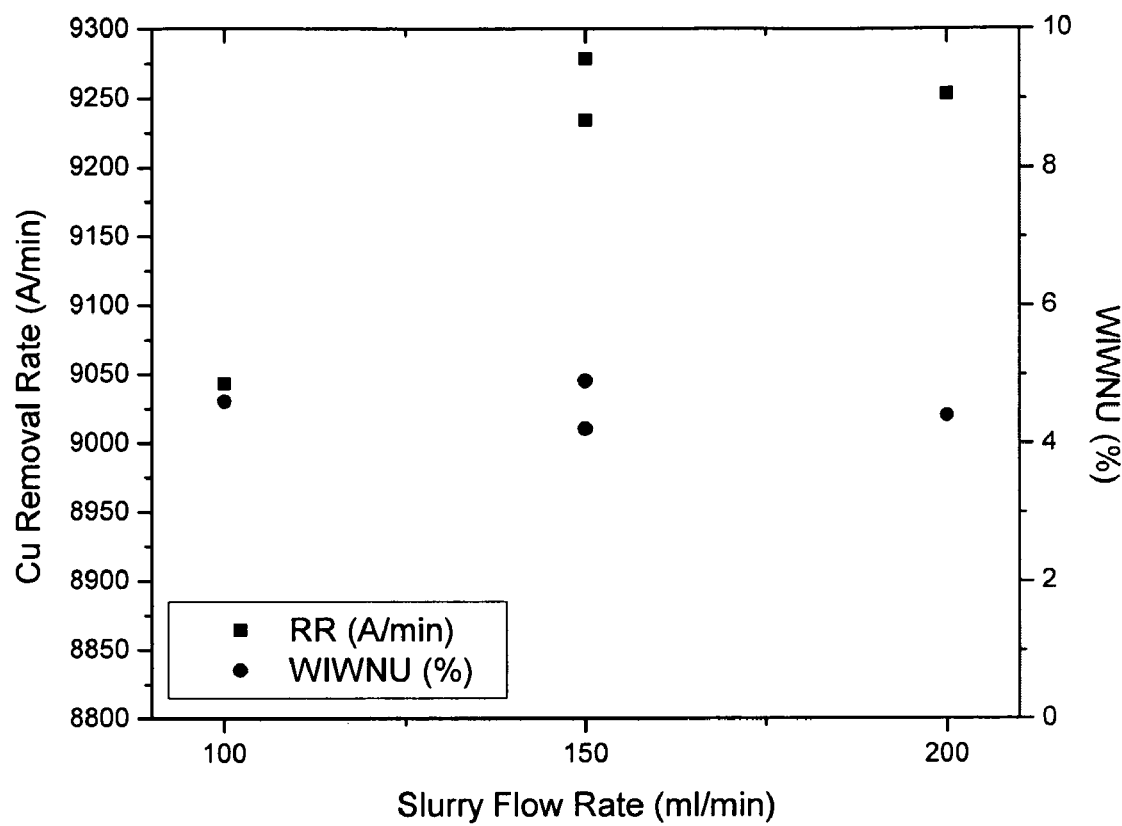
FIG. 2 graphically illustrates the copper removal rate in $\text{Å min}^{-1}$ and the percent within wafer non-uniformity (WIWNU) relative to the formulation flow rate in mL min$^{-1}$.

Referring to FIG. 2, it can be seen that the flow rate of the bulk copper removal formulation to platen 1 can be reduced from 200 mL min$^{-1}$ to 150 mL min$^{-1}$ without any significant loss in copper removal rate or changes to the WIWNU %. However, a 2.5% loss in copper removal rate was observed when the flow rate was decreased from 150 mL min$^{-1}$ to 100 mL min$^{-1}$. This is fundamentally important because the overall volume of bulk copper removal formulation used during bulk copper removal may be reduced to about 150 mL min$^{-1}$ without compromising removal rate or polishing uniformity.

Example 2

An experiment was performed to demonstrate the utility of the present invention. As discussed previously, it is an object of the present invention to provide a process including a single bulk copper removal CMP slurry formulation for planarization of a wafer surface having copper deposited thereon, the formulation having a high copper removal rate, a comparatively low barrier material removal rate, appropriate material selectivity ranges to minimize copper dishing at the onset of barrier material exposure, and good planarization efficiency.

Figure 4:
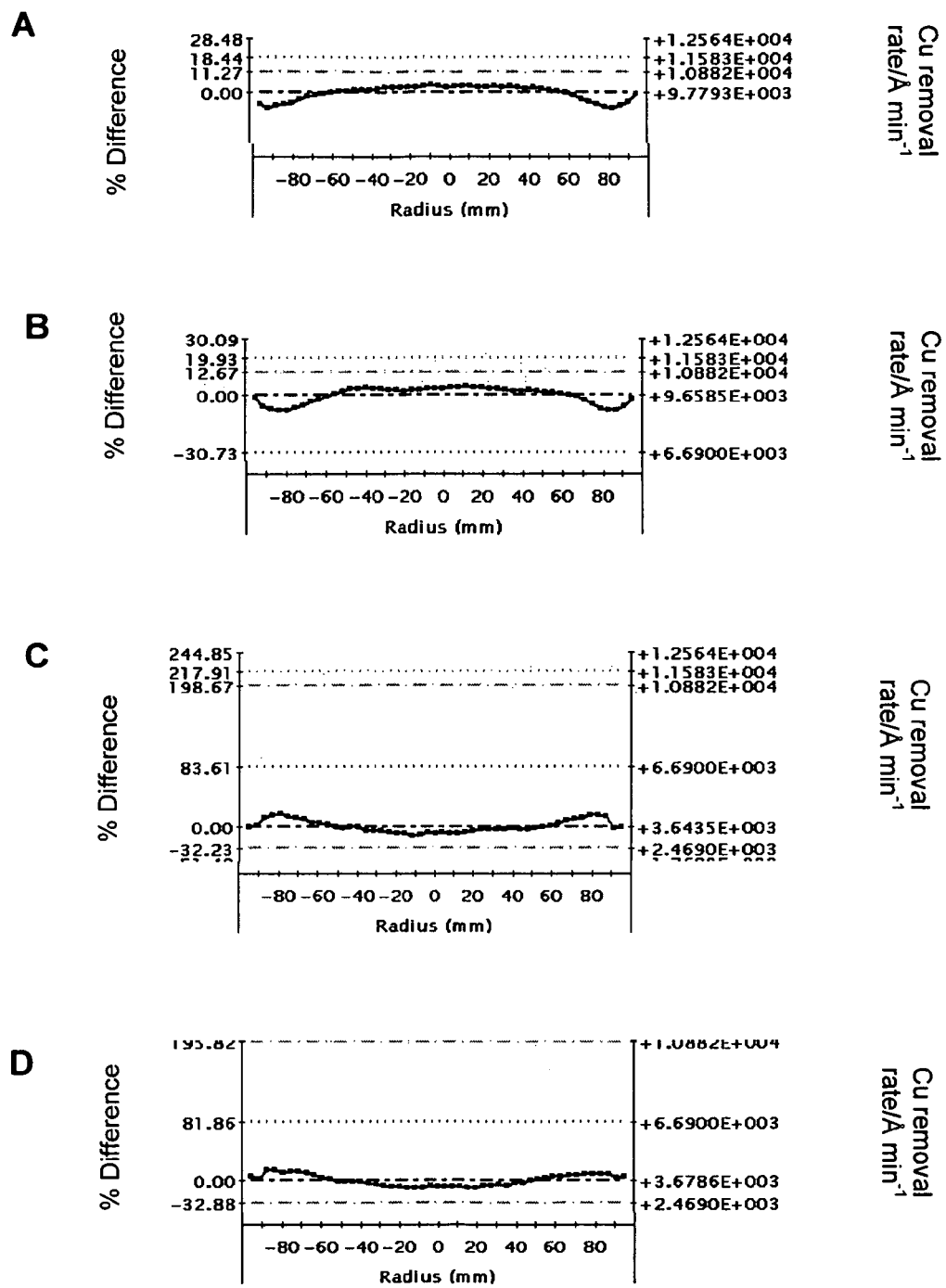
FIGS. 4A-4D illustrate the copper removal rate in $\text{Å min}^{-1}$ and the percent difference relative to the average copper removal rate, at points along a bisecting line of the wafer, for bulk copper removal at 3 psi downforce (FIGS. 4A and 4B) and "soft-landing" at 2 psi downforce (FIGS. 4C and 4D).

Blanket wafers, having a silicon substrate, a dielectric layer, barrier layer, and a 15,000 Å copper layer, were processed using the bulk copper removal formulation on platen 1 of a Mirra tool. The downforce of platen 1 was 3 psi. Thereafter, the wafers were transferred to platen 2 of the Mirra tool for processing using the soft-landing and overpolishing formulation. The soft-landing and overpolishing formulation had a bulk copper removal formulation to rheology agent-containing solution ratio of about 3.6:1. The processing conditions of soft-landing and overpolishing included a soft landing polish at a downforce of 2 psi until the endpoint was reached, followed by an over-polishing at a downforce of 1 psi. The results, including Cu removal rate and WIWNU %, are illustrated in FIG. 4 and summarized in Table 2 below.

TABLE 2

Bulk copper removal formulation flow rate
versus copper removal rate and WIWNU.

| Formulation | Cu removal rate (RR) (Å min$^{-1}$) | WIWNU % | Figure |
|---|---|---|---|
| bulk Cu removal | 9779 | 3.832% | 4A |
| bulk Cu removal | 9659 | 4.204% | 4B |
| soft landing & overpolishing | 3644 | 8.613% | 4C |
| soft landing & overpolishing | 3679 | 7.897% | 4D |

Referring to FIG. 4, it can be seen that the platen 1 process (FIGS. 4A and 4B) is typically convex, while the platen 2 soft landing process (FIGS. 4C and 4D) is typically concave to compensate for the platen 1 process. Together with the overpolish, the copper removal processes efficiently and uniformly remove copper during the copper removal CMP process. The high WIWNU during soft-landing and overpolishing was intended based on initial wafer measurements.

Table 3 includes the results of dishing and erosion for different processing conditions of the present invention using a 80 μm pad and 50% pattern density (PD) 0.18 μm array

TABLE 3

Dishing and erosion for different over-polishing times relative to bulk
copper removal composition to rheology agent-containing solution ratio.

| Wafer | Platen 1 time @ 3 psi/sec | Platen 2 times/sec | | ratio of bulk Cu removal composition to rheology agent-containing solution for platen 2 | Dishing/Å 80 μm pad center edge | Erosion/Å 0.18 μm array 50% PD center donut edge |
|---|---|---|---|---|---|---|
| | | soft landing @ 2 psi | over-polishing @ 1 psi | | | |
| 1 | 60 | 22 | 23 | ~3.6:1 | Cu res. — 181 | 72 97 115 |
| 2 | 60 | 22 | 28 | ~3.6:1 | 63 — 149 | 185 206 204 |
| 3 | 60 | 22 | 33 | ~3.6:1 | 241 — 474 | 158 195 191 |
| 4 | 60 | 22 | 28 | ~4.5:1 | 423 — 584 | 161 205 225 |
| 5 | 60 | 22 | 28 | ~2.8:1 | 333 — 453 | 174 199 213 |

Wafer 1 of Table 3 was slightly underpolished while wafers 2-5 had essentially no remaining copper residue following the over-polishing step. It can be seen that dishing and erosion have a weak dependence of the ratio of bulk copper removal composition relative to rheology agent-containing solution indicating a robust process window.

The bulk copper removal composition and soft-landing and overpolishing composition of the invention can be utilized in a conventional manner in the copper removal CMP operation, by application of the CMP composition to the copper surface on the wafer substrate in a conventional fashion, and polishing of the copper surface can be carried out using a conventional polishing element such as a polishing pad, polishing belt, or the like.

Accordingly, the single CMP formulation, i.e., the bulk copper removal formulation, may be used to (a) rapidly planarize the copper on the semiconductor wafer surface, and (b) upon combination with a rheology agent-containing solution, forming the soft-landing and overpolishing formulation, efficaciously polish the surfaces of copper elements with negligible dishing or erosion.

Following the completion of the copper removal polish according to the present invention, the wafer may be transferred to a third platen for barrier removal polishing thereon.

Example 3

An experiment was performed to determine the change of coefficient of friction (COF) of a composition that includes frictive agent relative to the same composition without a frictive agent. Specifically, the generic composition without a frictive agent, hereinafter Cerulean-NF (Cer-NF or Cer-0), includes:

0.8 wt. % of 5-aminotetrazole
1 wt. % of alumina coated silica
<0.05 wt. % potassium hydroxide
water (about 88.9 wt. %)

Figure 5:
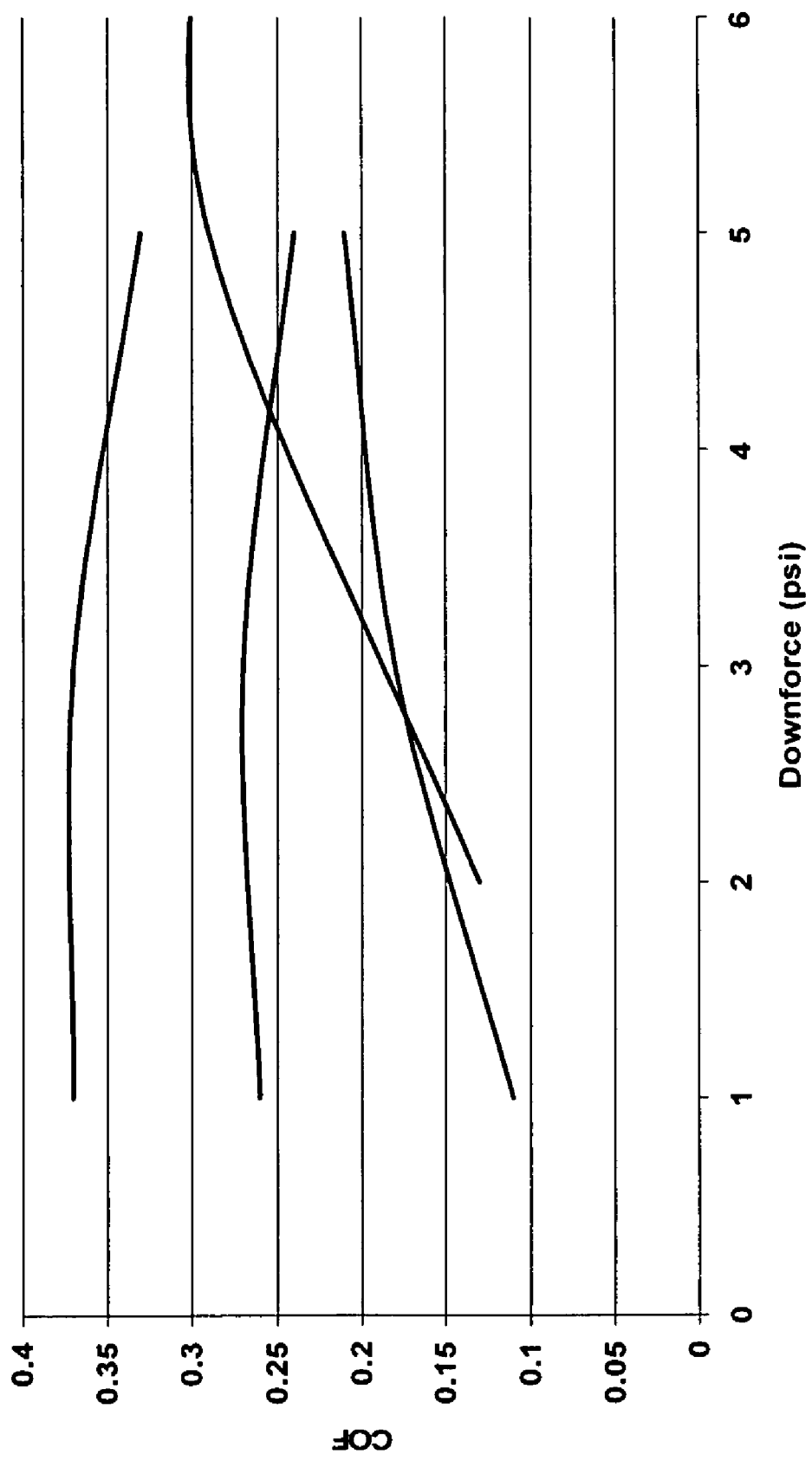
FIG. 5 illustrates the change in the coefficient of friction due to the inclusion of glycine as a frictive agent relative to increasing the downforce pressure of the polishing device maintained at 120 rpm.

The formulation including frictive agent includes Cer-NF and 4% of glycine (hereinafter Cerulean 4 (Cer-4)). Blanket wafers, having a silicon substrate, a dielectric layer, barrier layer, and a 15,000 Å copper layer, were processed using the bulk copper removal formulation on a platen of a Mirra tool. As shown in FIG. 5, increasing downward pressure was applied and the rotating platen was maintained a 120 rpm. It is evident that the COF of the copper surface was increased with the use of Cer-4, and the COF for Ta was decreased with the use of the Cer-4 composition. Interestingly, as the pressure increased against the rotating platen, the COF for copper decreased slightly while the COF for Ta increased.

Example 4

Two different CMP compositions, Cer-4 and Cerulean (Cer-6), both of which include glycine as a frictive agent, were compared relative to a composition that did not include the frictive agent (Cer-NF). Cer-6 included:

Aminotetrazole
Hydrogen peroxide
Alumina coated silica
4% to 6% Glycine.

Figure 6A:
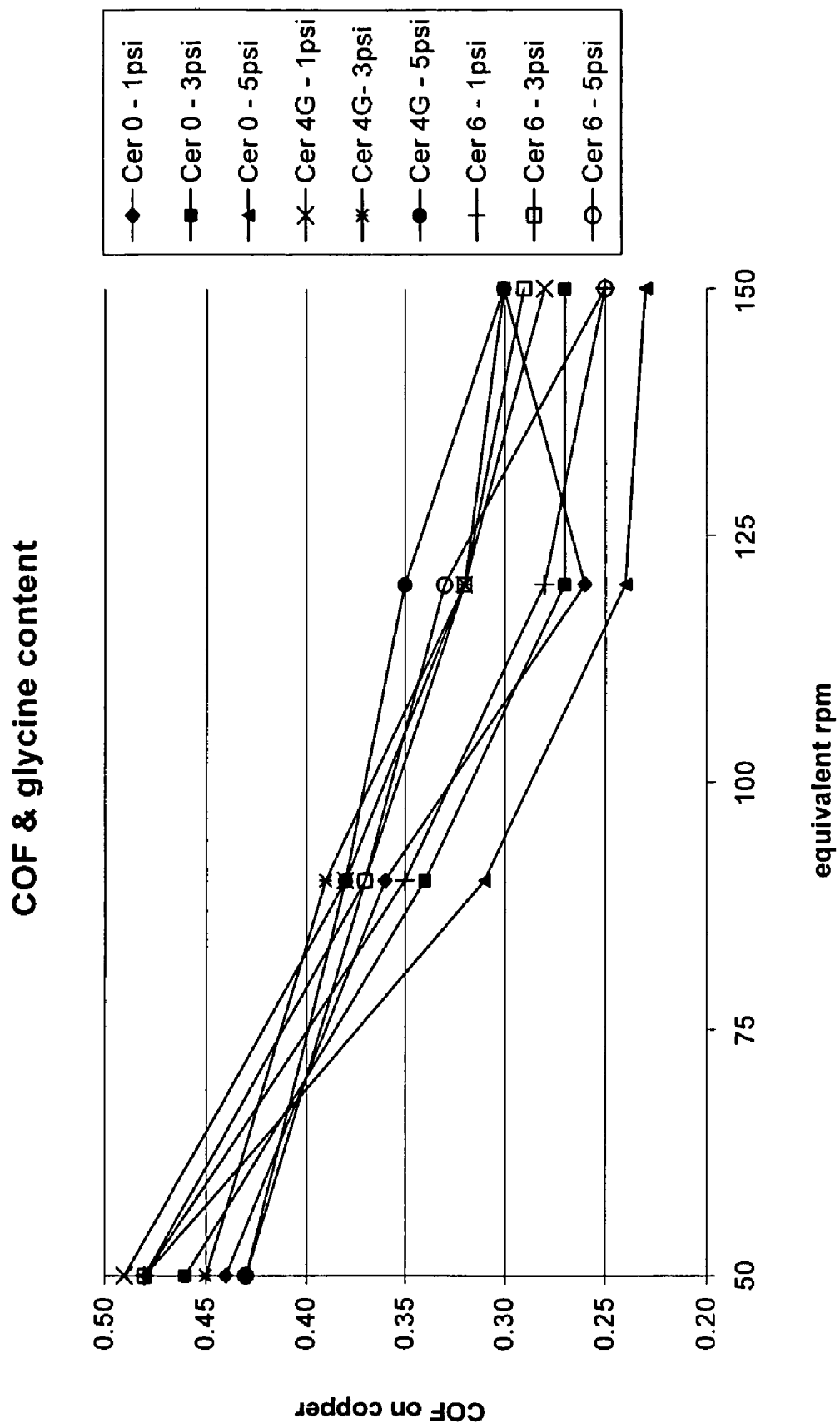
FIGS. 6A and 6B graphically illustrates the change in the coefficient of friction due to the inclusion of glycine as a frictive agent in different CMP compositions relative to increasing downforce pressure of the polishing device at constant rpm.
Figure 6B:
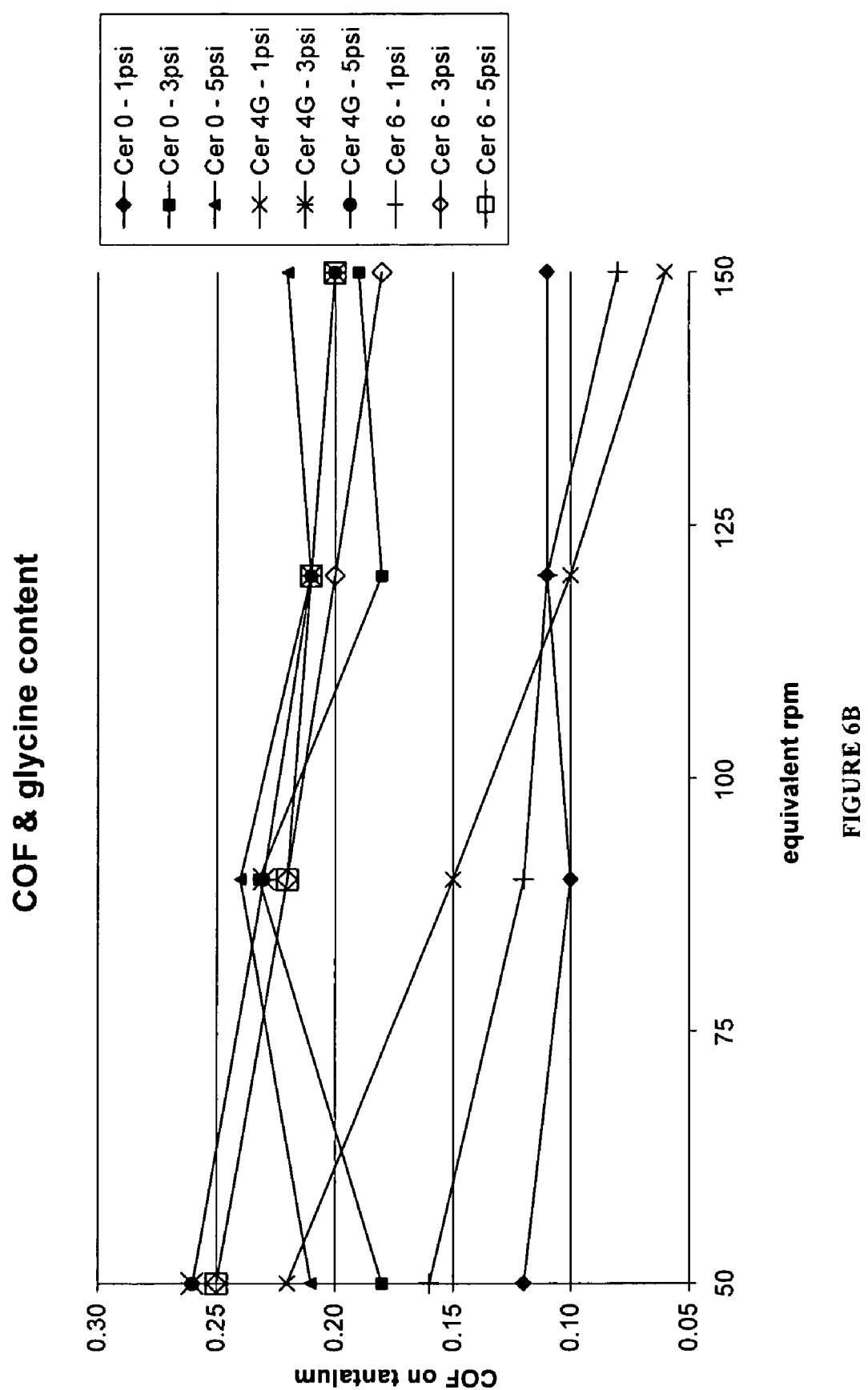

As shown in FIG. 6A, the COF of the glycine-containing compositions at the copper surface remained essentially constant, and the COF for the Cer-NF shows a lower COF. As the rpm of the rotating platen increased, the COF decreased for all compositions. FIG. 6B illustrates the results of the polishing of a tantalum surface with the composition Cer-NF, Cer-4 and Cer-6. The COF of Ta surface is much lower than that of copper and as the concentration of glycine increases the COF decreases. Interestingly, the COF of the Ta surface was not affected by the increasing speed of the rotating platen.

Example 5

Figure 7A:
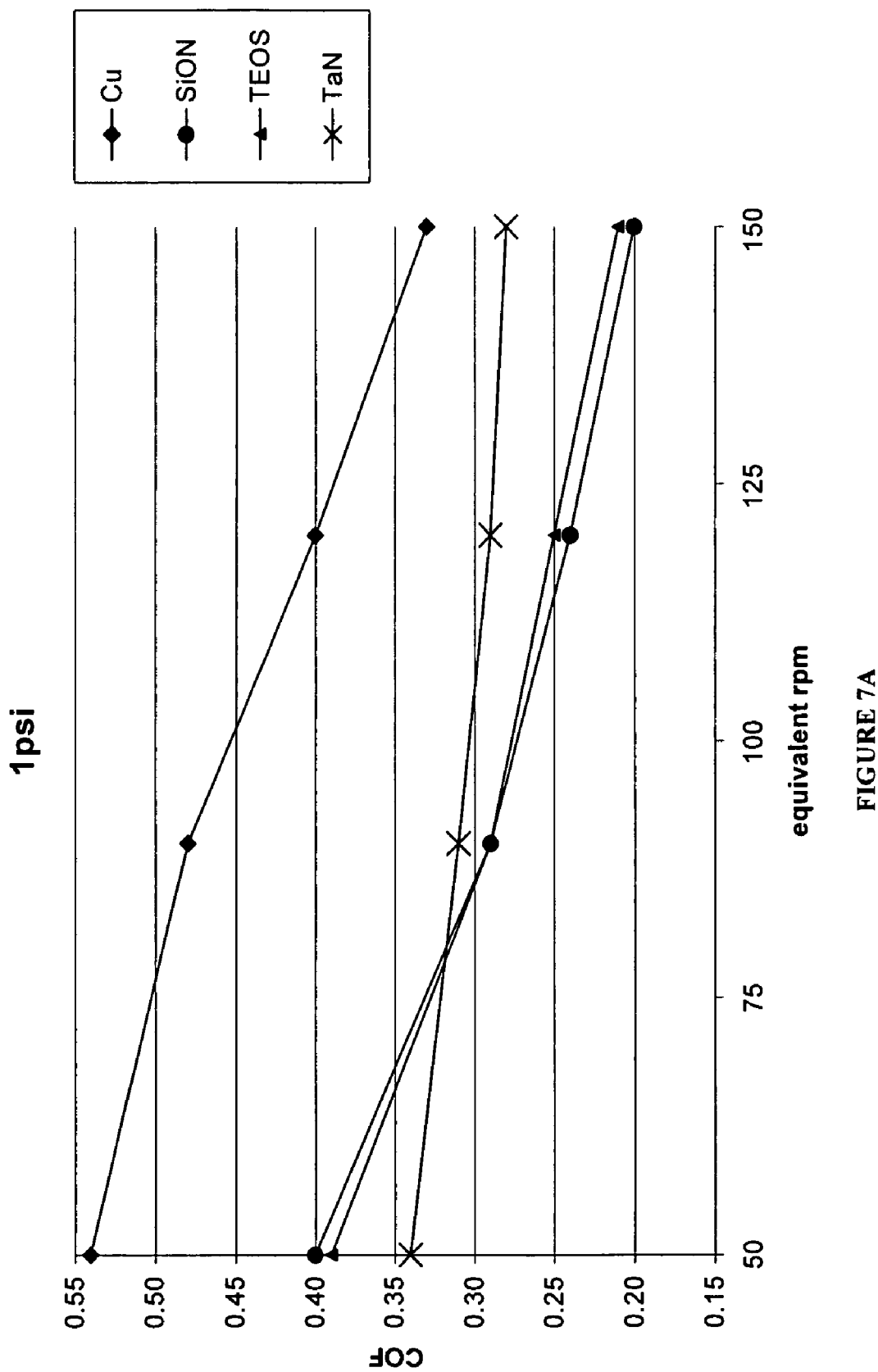
FIGS. 7A, 7B, and 7C graphically illustrates the increase in the coefficient of friction with the copper surface relative to other materials due to the inclusion of glycine as a frictive agent relative to increasing downforce pressure of the polishing device at constant rpm.
Figure 7B:
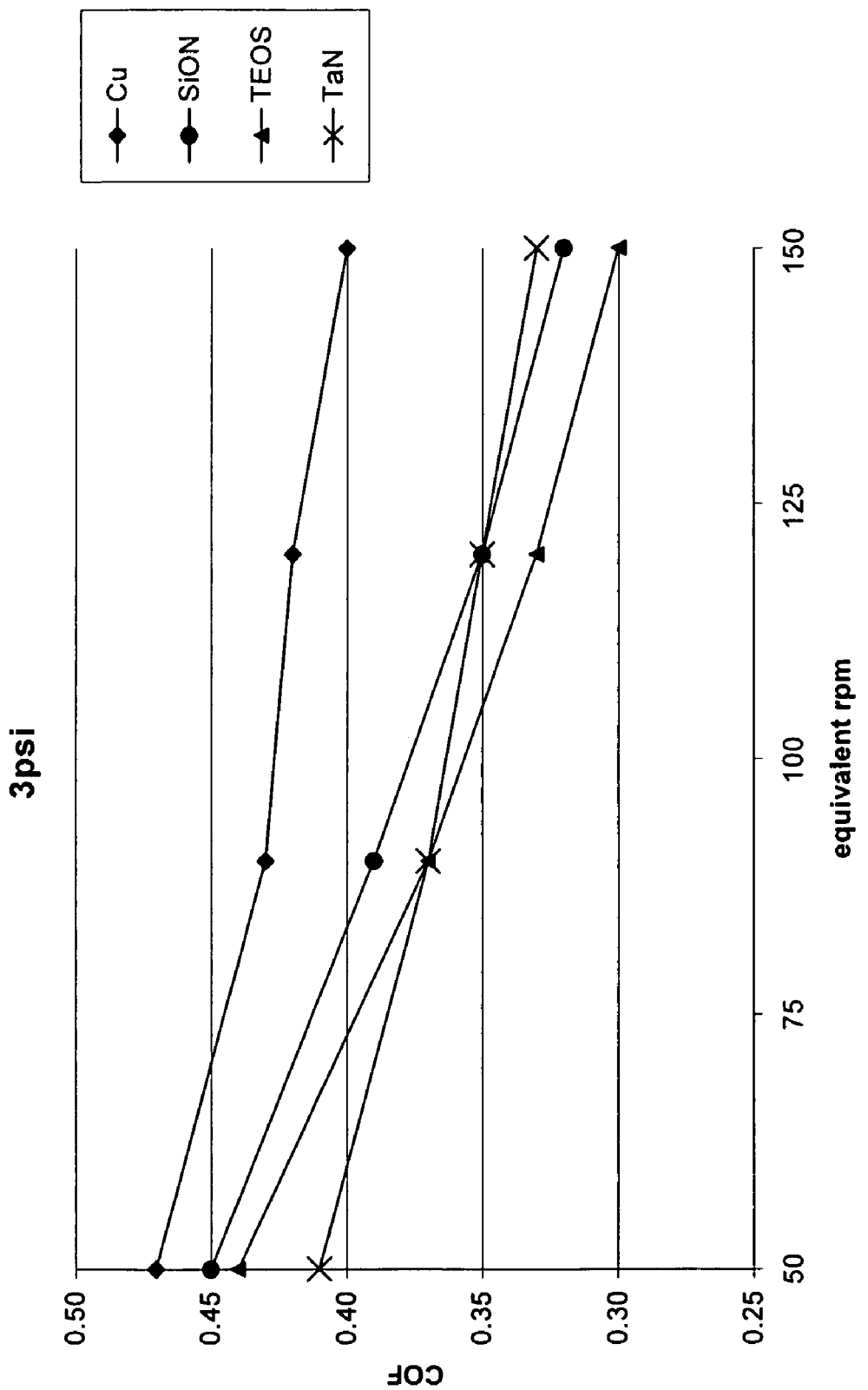
Figure 7C:
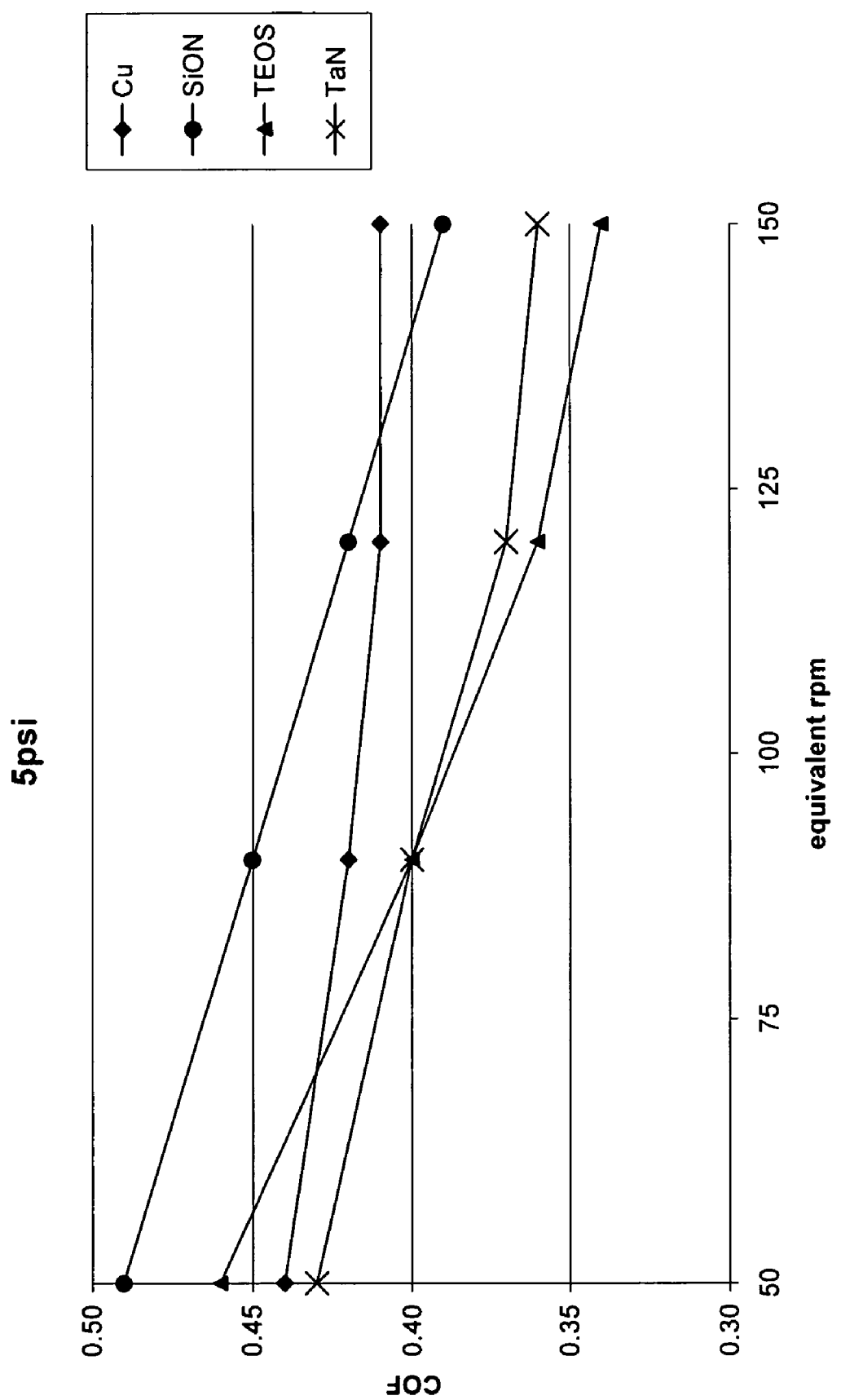
Figure 8A:
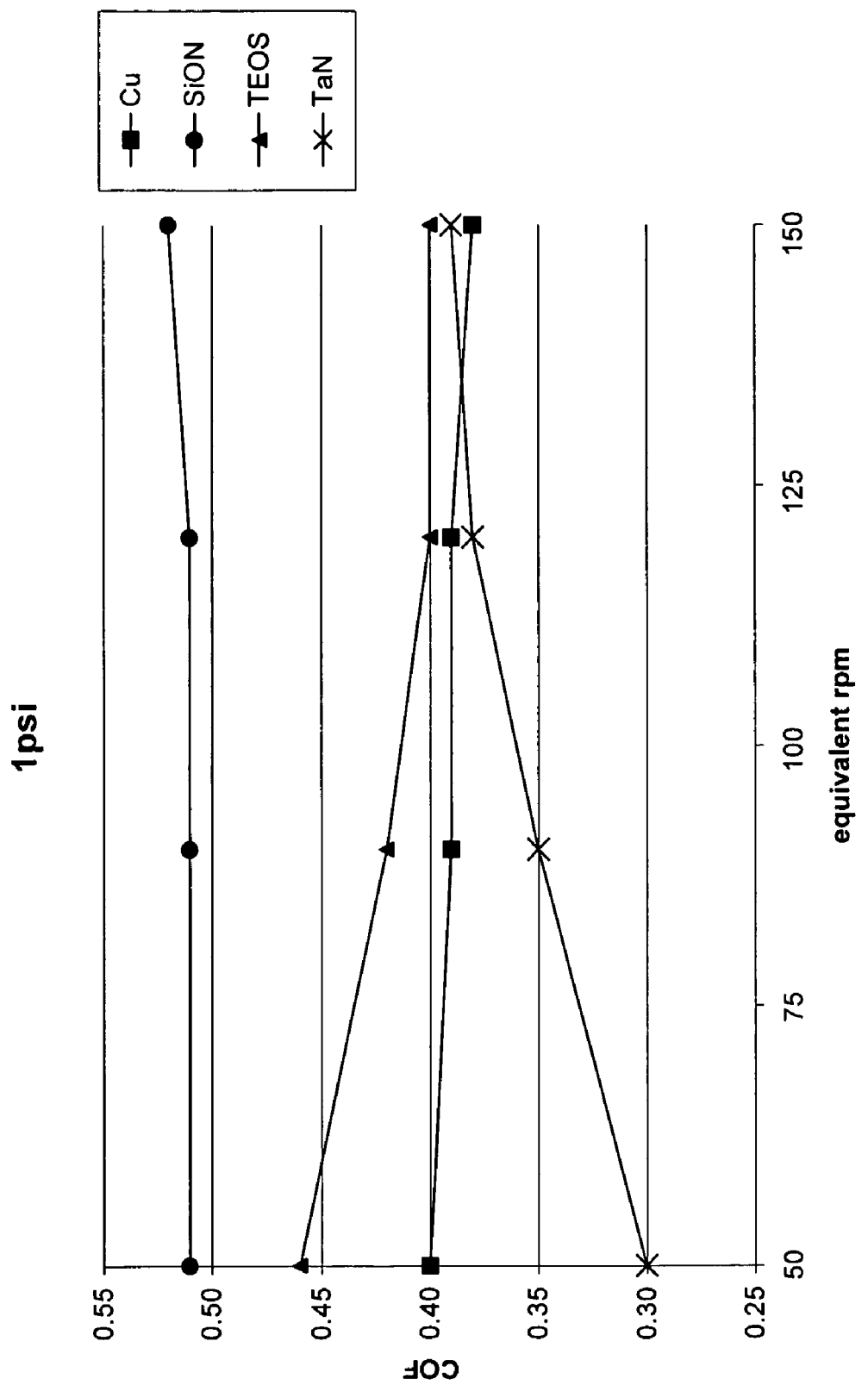
FIGS. 8A, 8B, and 8C graphically illustrates the increase in the coefficient of friction with TaN and SiON surfaces due to inclusion of a frictive agent with increased sensitivity for TaN and SiON surfaces relative to increasing downforce pressure of the polishing device at constant rpm.
Figure 8B:
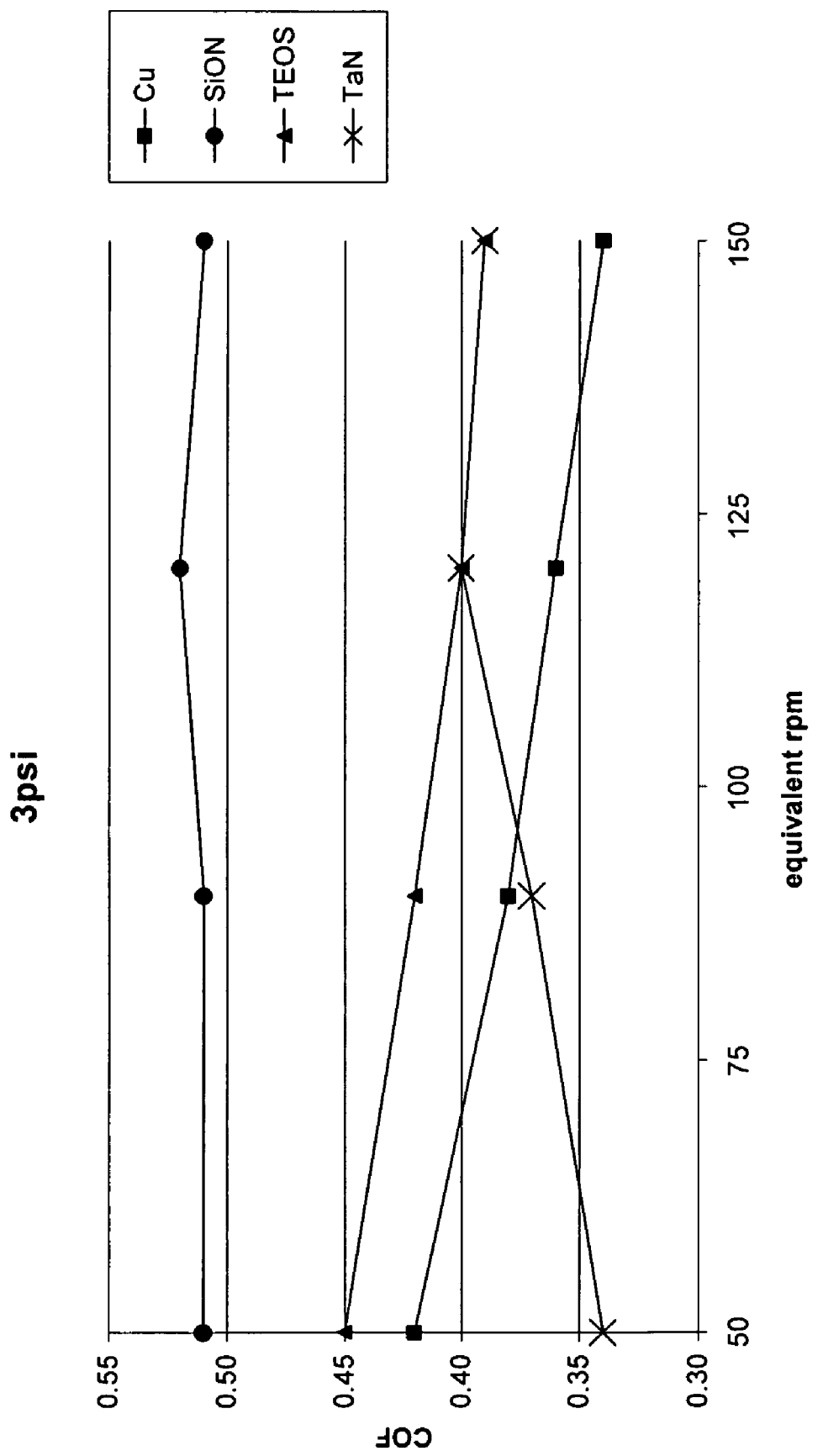
Figure 8C:
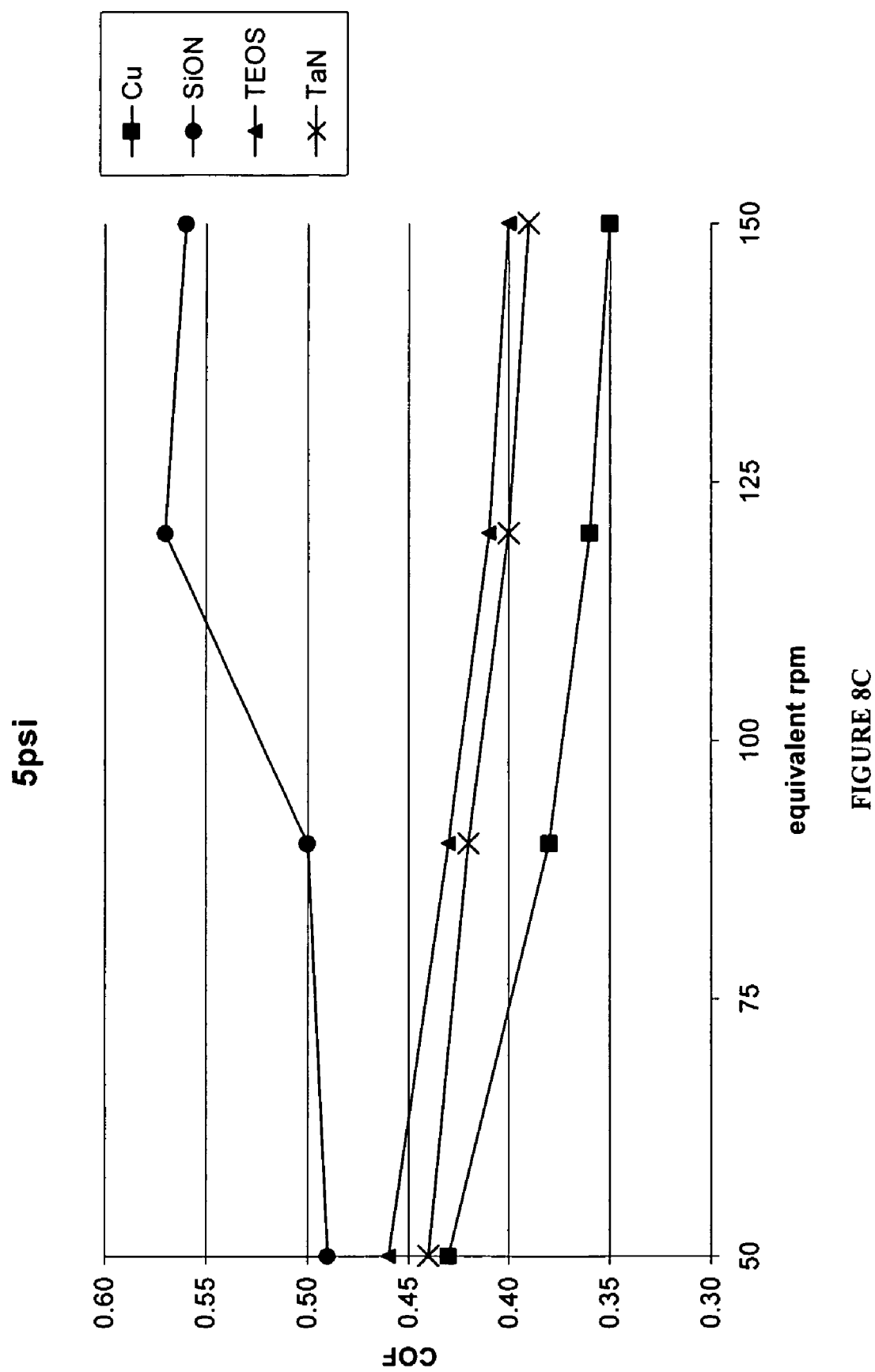

FIGS. 7A, 7B, and 7C and FIGS. 8A, 8B, and 8C illustrate the results of using a two phase polishing solution wherein Step I composition effectively reduced the bulk of copper surface and Step II composition more effectively polished the Ta and dielectric substrate surface. Step I composition comprised an acid stable silica, 1,2,4 triazole, hydrogen peroxide and glycine as a frictive agent. As shown in FIGS. 7A, 7B, and 7C, this composition increased the COF of copper of copper relative to the TaN surface. As the rpm of the rotating platen increased the COF of TaN merges towards the values for copper. The Step 11 composition comprises an acid stable silica, 1,2,4 triazole, 0.15% hydrogen peroxide but instead of the frictive agent glycine, the composition further comprises phthalic acid and polyacrylic acid which increases the selectivity for the Ta surface and dielectric surface. As shown in FIGS. 8A 8B, and 8C, the COF increased for the SiON and TaN surfaces while the COF for copper decreased.

Example 6

To demonstrate the effect of dilution on copper removal rates, copper removal CMP compositions were diluted and the Cu removal rates were determined using electrochemical methods.

By way of example, the initial copper removal CMP compositions were diluted with deionized water to yield diluted copper removal CMP slurries. Blanket copper wafers were immersed in each respective slurry and the Cu removal rates in Angstroms per minute were measured.

Figure 9:
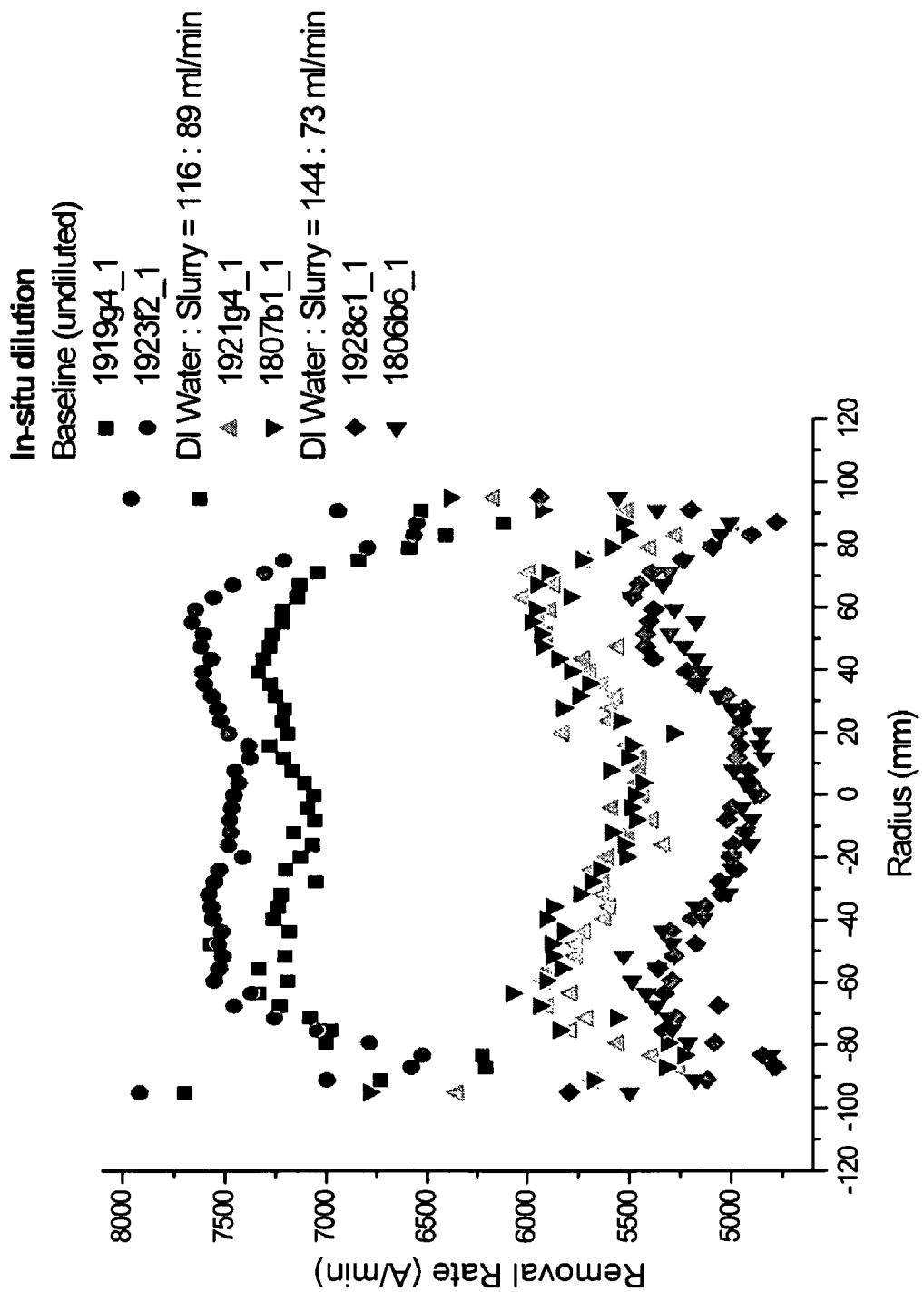
FIG. 9 illustrates the effect of dilution of the CER4 slurry on the removal rates of copper at 3 psi in Angstroms per minute.
Figure 15:
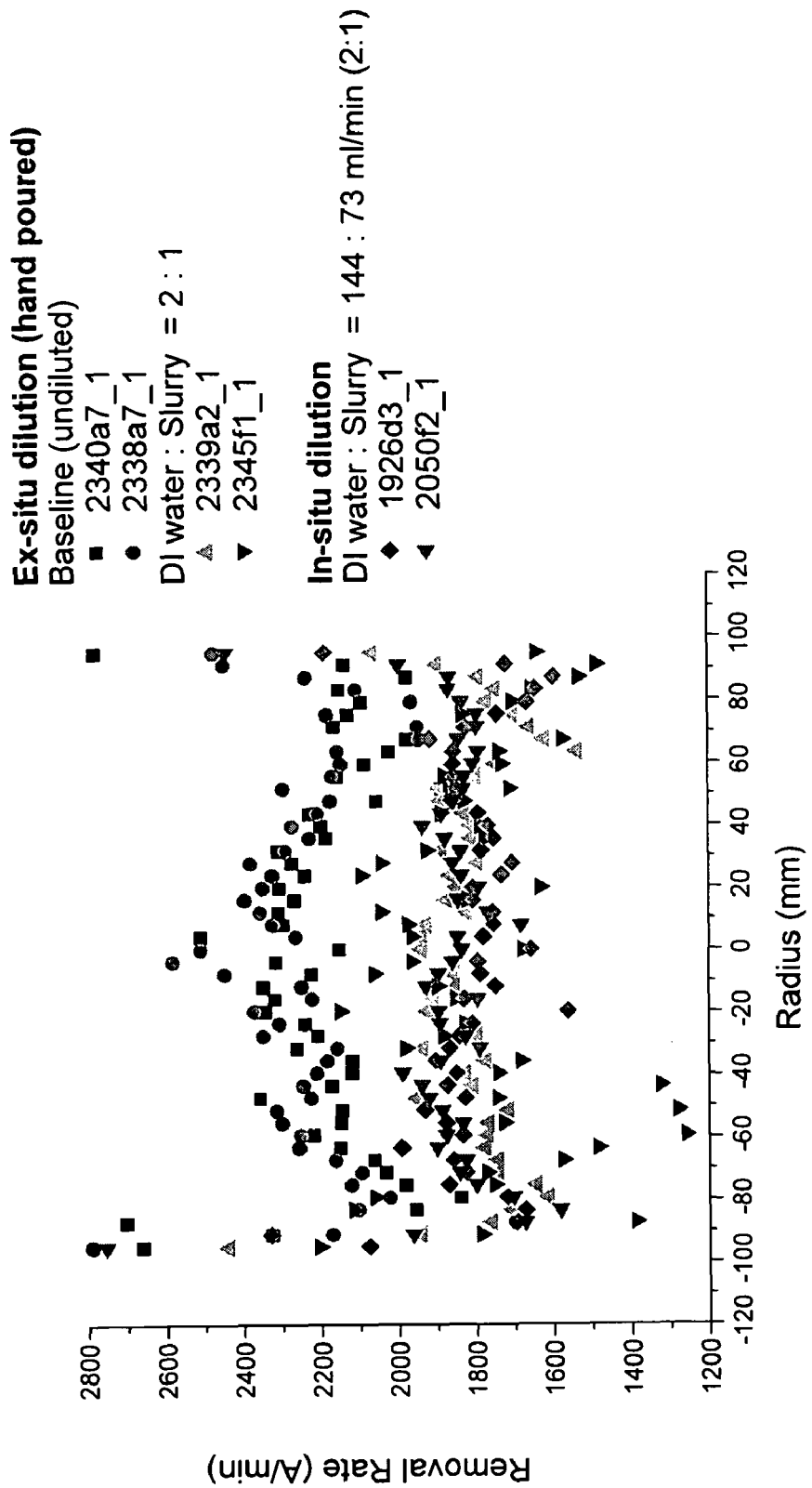
FIG. 15 is a plot showing the removal rates relative to dilution (2:1) and methods of such dilution.
Figure 16:
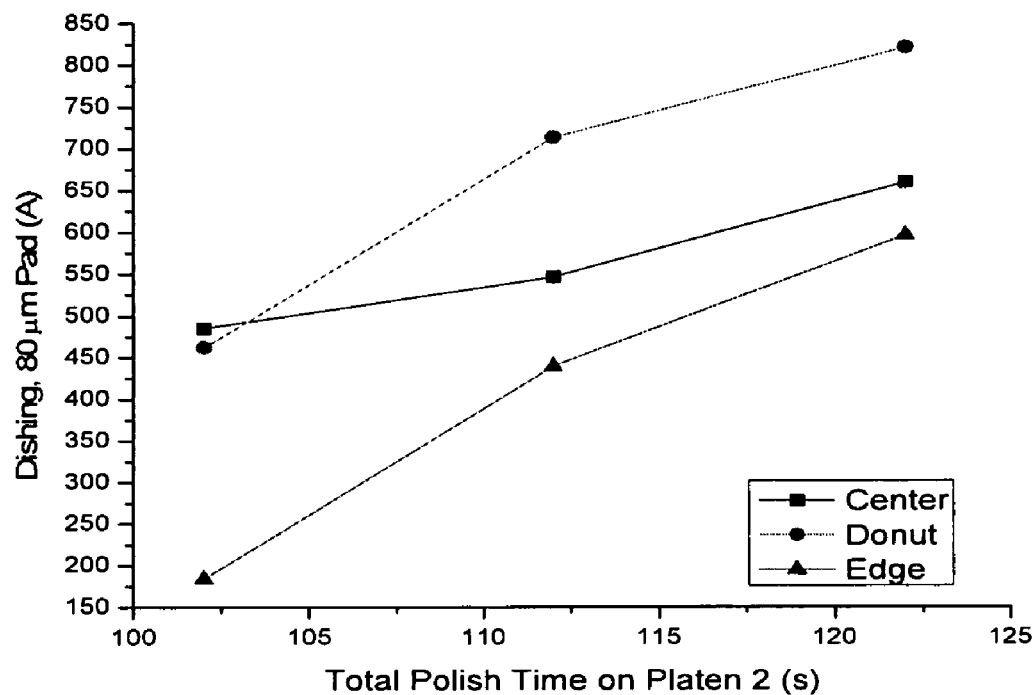
FIG. 16 shows two graphs illustrating the selectivity of dishing both before and after dilution of a CER 6 solution.
Figure 16:
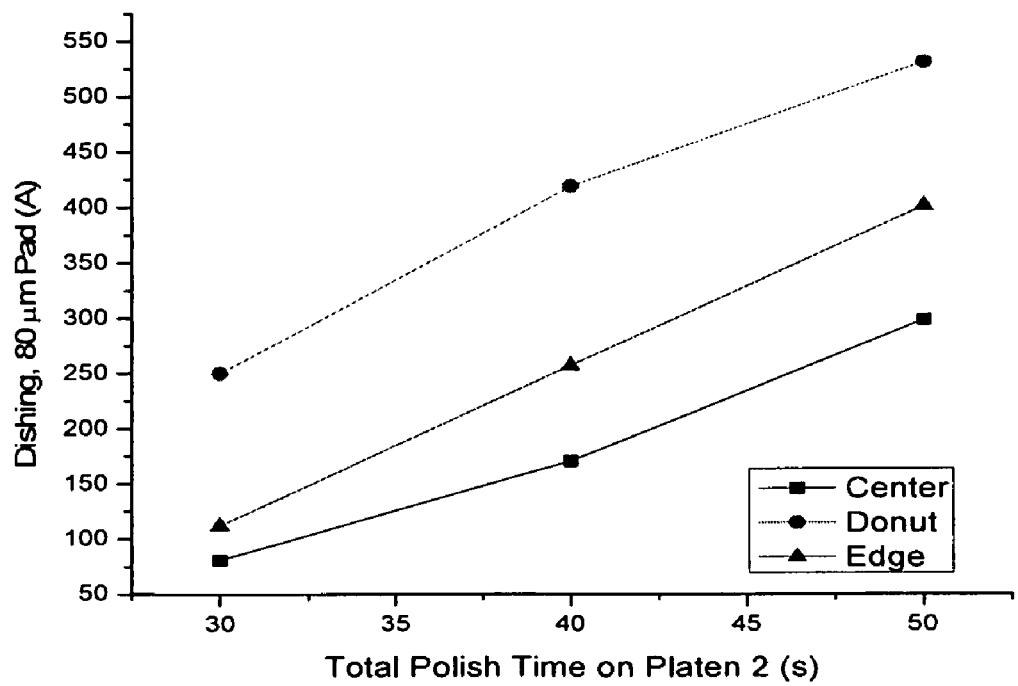

FIG. 9 shows the removal effects of Cu on a wafer using diluted and undiluted CER6 solutions at specific points on the wafer (at 3 psi down force). For example, in the undiluted form, there is reduced removal on the edge of the wafer and increased removal rate in the center of the disk. As dilution of the slurry increases, there is reduced removal of copper across the surface of the wafer and significantly reduced dishing in the center of the wafer. This effect can be further seen in FIGS. 16A and 16B, specifically FIG. 16B, wherein the dishing in the center of the wafer is reduced by dilution of the solution. Notably, in FIG. 15, wherein the planarizing is conducted at 1 psi, the separation of the results is not as well defined between diluted and undiluted solutions and clearly, the removal rate is greatly reduced with the lower pressure exerted on the pad against the platen.

Figure 10:
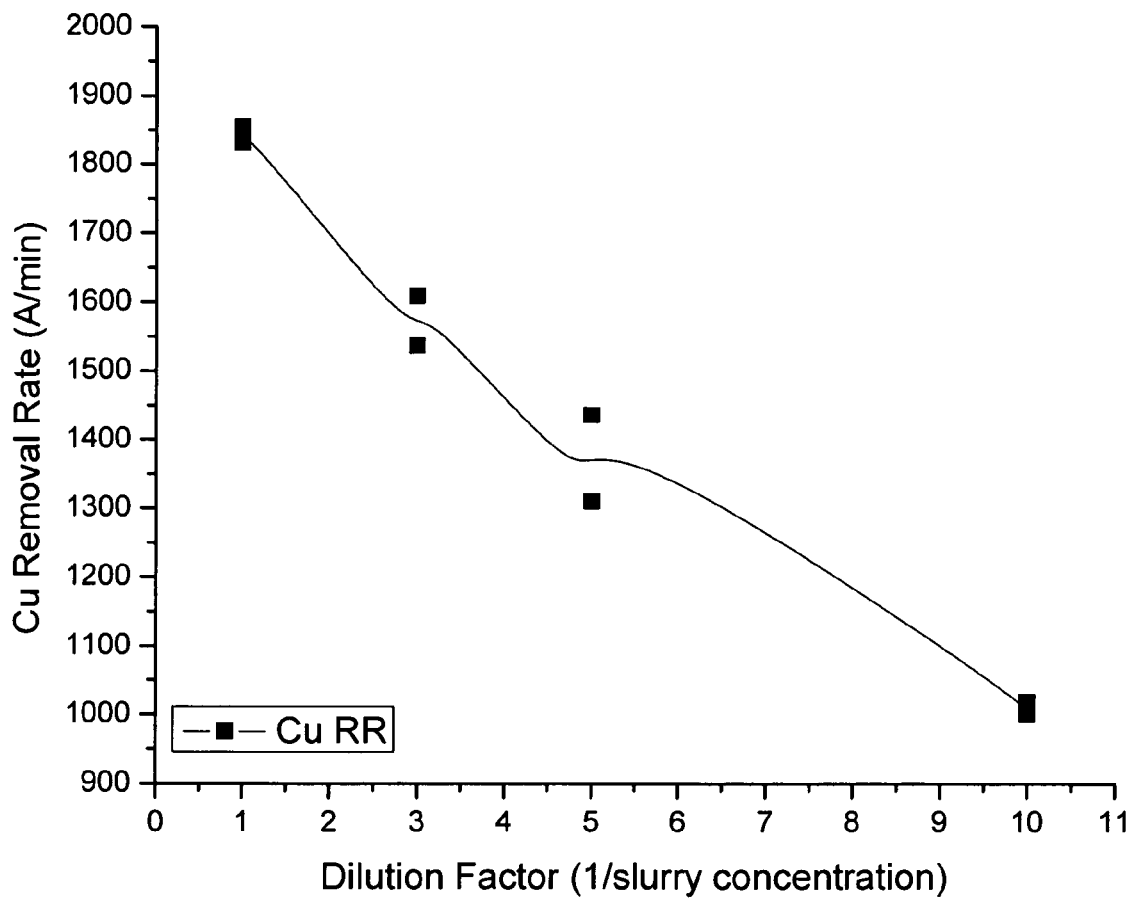
FIG. 10 illustrates that as the dilution factor increases, the removal rate of copper decreases.
Figure 12:
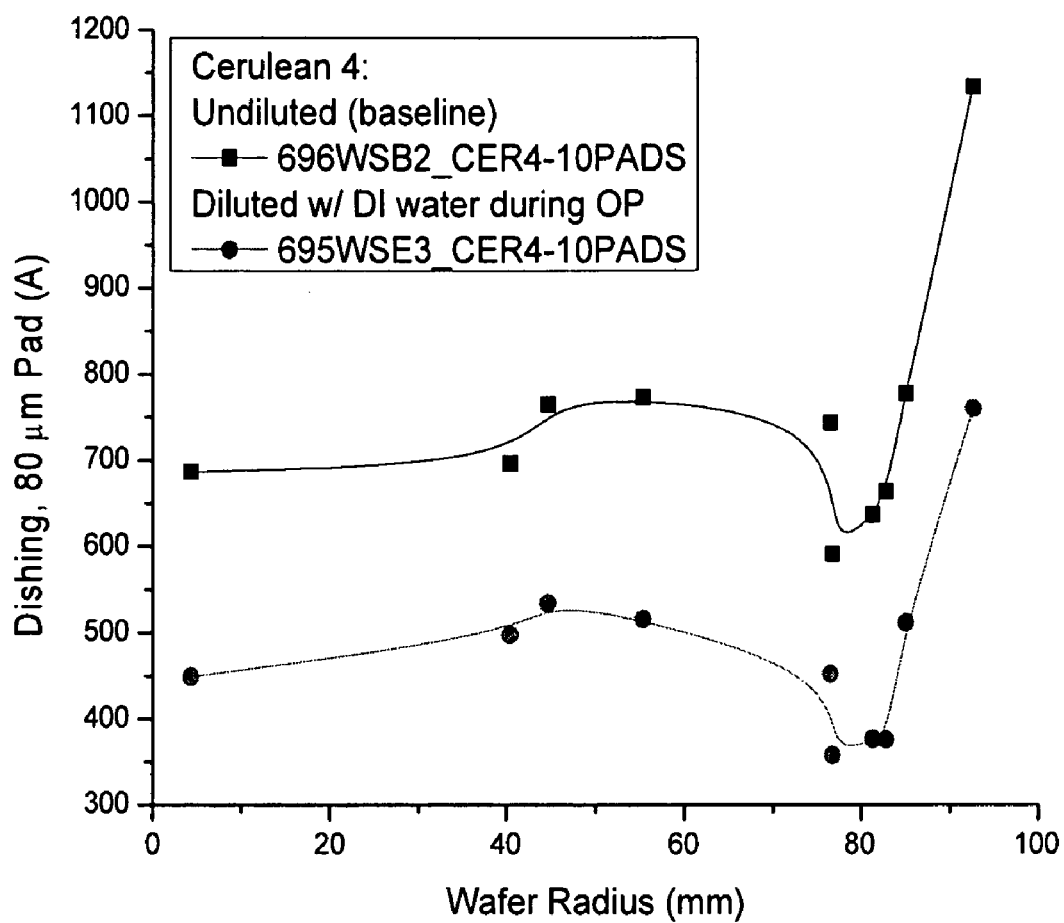
FIG. 12 illustrates the reduced removal rate of copper using the CER 4 slurry when diluted and in comparison to an undiluted solution.

FIG. 10 is a plot showing the linear decrease of the blanket removal rate with increasing slurry dilution and as such, dilution during the overpolish will concomitantly decrease dishing values. This is further evidenced by the results shown in FIG. 12 wherein the diluted Cer-4 slurry shows reduced dishing in the center of the wafer and AT the edges when compared to the undiluted slurry.

Figure 11:
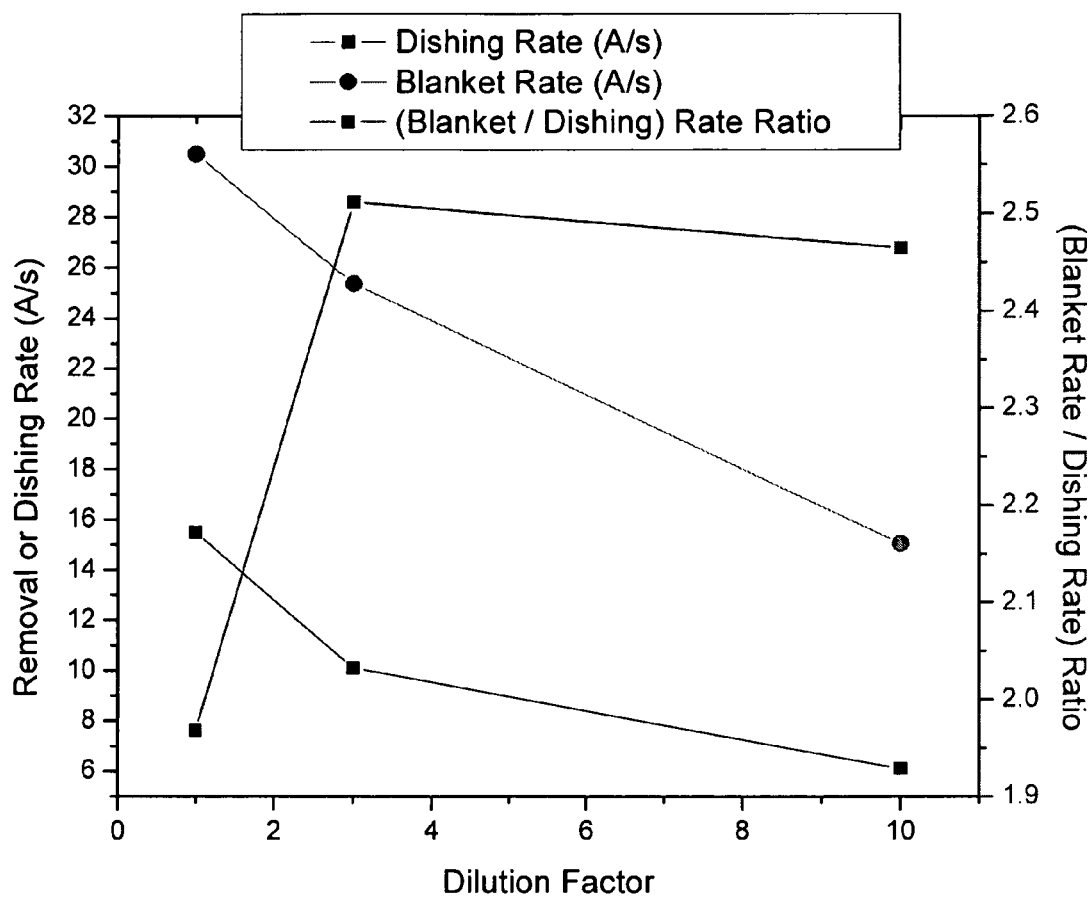
FIG. 11 is a plot showing multiple results including dishing rate, blanket removal rate and the blanket/dishing rate ratio relative to the dilution factor.

FIG. 11 is a plot showing multiple results including dishing rate, blanket removal rate and the blanket/dishing rate ratio relative to the dilution factor. Specifically, three Sematech 854 wafers were polished with undiluted Cer-4 to clear all Cu from the surface. Then the three wafers were further polished for another 10 sec with the undiluted solution, one that had been diluted 3 times and one diluted ten (10) times. The pre- and post-dishing values were measured and dishing rates computed. As shown in FIG. 11, both dishing and blanket removal rates were decreased with increasing dilution. The blanket/dishing ratio is greater for the diluted slurries than the undiluted one.

Figure 13:
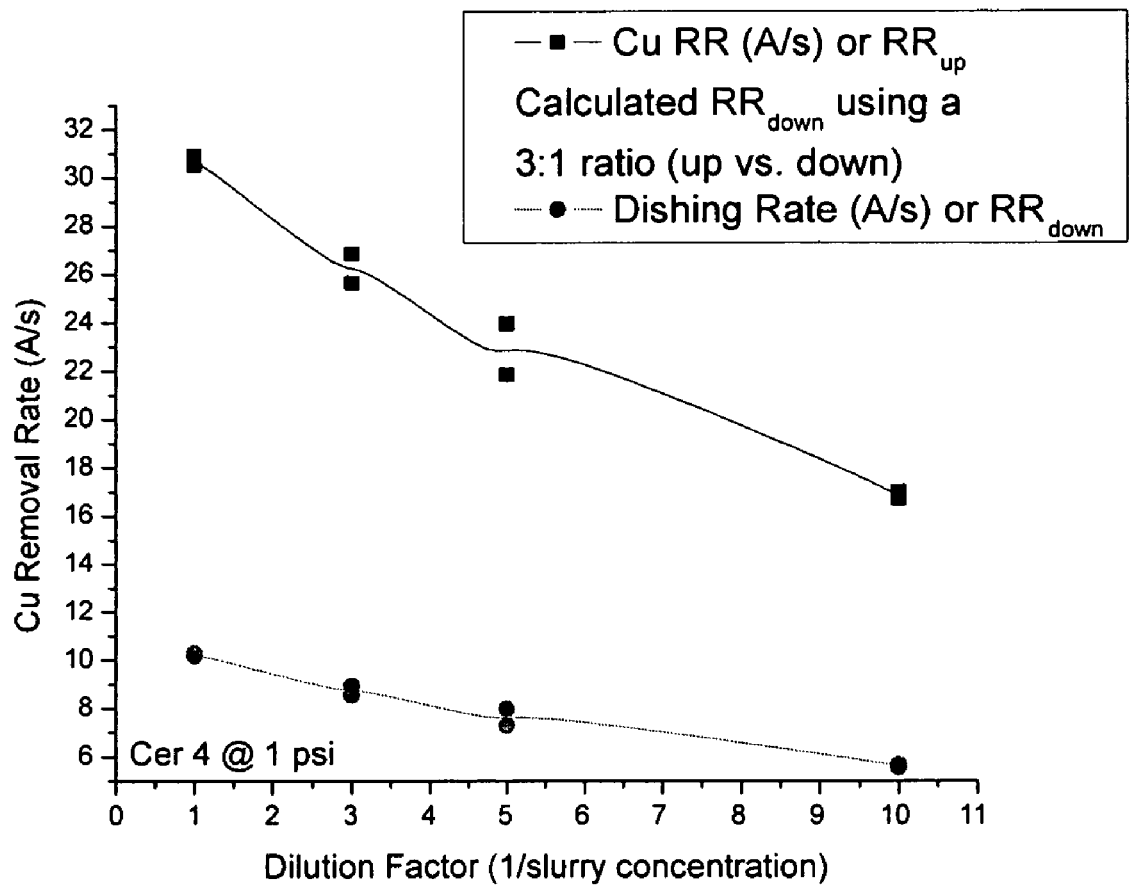
FIG. 13 is a graph showing the dishing rate is greatly reduced as the dilution factor increases (slurry concentration decreases).
Figure 14:
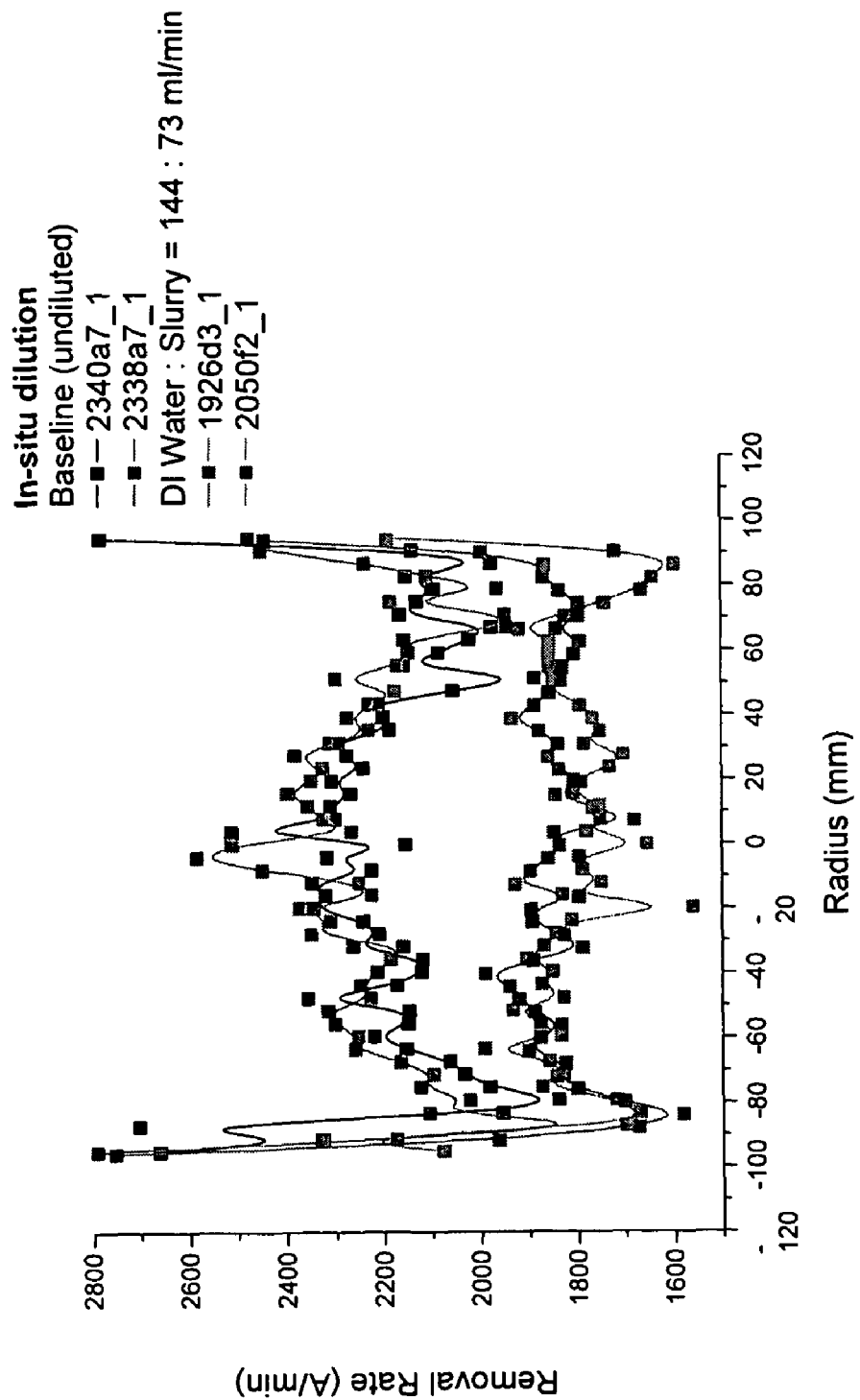
FIG. 14 is a plot showing the results of polishing using the CER 4 solution at 1 psi in both diluted and undiluted form.

FIGS. 13 and 14 show the results of polishing with diluted Cer-4 solutions at 1 psi down force. FIG. 13, shows the copper removal at Angstroms per sec. It is evident that as the dilution factor increases, meaning the concentration of the slurry is decreased, copper removal is reduced and dishing is reduced. FIG. 14 provides additional proof that diluted slurry with an approximate ratio of water:slurry of 2:1 shows reduced copper removal across the face of the wafer and clearly a more consistent removal across the surface. In contrast, the undiluted slurry caused an increased dishing in the center of the wafer.

While the invention has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A method of polishing a microelectronic device substrate on a platen, said method comprising:
   (a) contacting the substrate on a first platen for sufficient time and under first chemical mechanical polishing (CMP) conditions with a first CMP composition effective for planarizing and removing copper from the substrate; and
   b) contacting the substrate on the first platen for sufficient time and under second CMP conditions with a second CMP composition comprising the first CMP composition modified by an in-situ addition of at least one additive selected from the group consisting of deionized water, organic solvent, pH adjusting agent, rheology agent, chelating agent, passivating agent, fictive agent, polymeric additive, and combinations thereof, wherein the second CMP composition is effective for removing copper overburden and exposing a barrier material layer, wherein the second CMP composition has a copper static etch rate less than that of the first CMP composition, wherein the rheology agent is selected from the group consisting of modified cellulose derivatives, cellulose ethers, starch derivatives, pectin derivatives, proteins and natural polymers, and wherein the polymeric additive comprises polyvinylpyrrolidone.

2. The method of claim 1, wherein the first CMP composition comprises at least one oxidizing agent, at least one inhibiting agent, at least one abrasive and at least one solvent.

3. The method of claim 2, wherein the at least one abrasive comprises an abrasive species selected from the group consisting of silica, alumina, silicon carbide, silicon nitride, iron oxide, ceria, zirconium oxide, tin oxide, titanium dioxide, organic polymer particles, epoxies, urethanes, polyesters, polyamides, polycarbonates, polyolefins, polyvinylchloride, polystyrenes, polyolefins, (meth)acrylics, alumina-coated colloidal silica, coated and doped particles, and mixtures of two or more of such components;
   wherein the at least one oxidizing agent oxidizing comprises a compound selected from the group consisting of: hydrogen peroxide, ferric nitrate, potassium iodate, potassium permanganate, nitric acid, ammonium chlorite, ammonium chlorate, ammonium iodate, ammonium perborate, ammonium perchlorate, ammonium periodate, ammonium persulfate, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, 4-methylmorpholine N-oxide, pyridine-N-oxide, urea hydrogen peroxide, and mixtures of two or more of such components;
   wherein the at least one passivating agent comprises a compound selected from the group consisting of imidazole, aminotetrazole, benzotriazole, benzimidazole, oxalic acid, malonic acid, succinic acid, nitrilotriacetic acid, iminodiacetic acid, 5-aminotetrazole (ATA), 5-aminotetrazole monohydrate, and derivatives and combinations thereof; and
   wherein the at least one solvent comprises a compound selected from the group consisting of water, methanol, ethanol, propanol, butanol, ethylene glycol, propylene glycol, glycerin, and combinations thereof.

4. The method of claim 2, wherein the first CMP composition further comprises at least one fictive agent selected from the group consisting of glycine, alanine, aspartic acid, asparagine, histadine, leucine, glutamic acid, serine, valine, and proline.

5. The method of claim 1, wherein the rheology additive is selected from the group consisting of hydroxypropylcellulose (HPC), hydroxyethylcellulose, carboxymethylcellulose, and mixtures thereof.

6. The method of claim 1, wherein the first CMP composition comprises hydrogen peroxide, alumina-coated colloidal silica, 5-aminotetrazole (ATA), and water.

7. The method of claim 1, wherein the first CMP conditions comprise: platen downforce in a range from about 1 psi to about 7 psi; flow rate in a range from about 10 mL min$^{-1}$ to about 10 L min$^{-1}$; or combinations thereof.

8. The method of claim 1, wherein the barrier material layer comprises material selected from the group consisting of tantalum, titanium, tungsten, ruthenium, nitrides and silicides thereof, and combinations thereof.

9. The method of claim 1, wherein the rate of planarization using the first CMP composition is in a range from about 6,000 Å min$^{-1}$ to about 15,000 Å min$^{-1}$.

10. The method of claim 1, wherein the second CMP conditions comprise platen downforce in a range from about 0.1 psi to about 4 psi.

11. The method of claim 1, wherein the ratio of first CMP composition to rheology agent in the second CMP composition is in a range from about 10:1 to about 10,000:1.

12. The method of claim 1, wherein the copper is planarized using the first CMP composition and barrier material layer exposed using the second CMP composition at the first platen.

13. The method of claim 1, wherein the second CMP conditions comprise a soft landing platen downforce in a range from about 1 psi to about 4 psi and an over-polish platen downforce in a range from about 0.1 psi to about 4 psi.

14. The method of claim 1, wherein said at least one additive is mixed with the first CMP composition in-line upstream of the platen.

15. The method of claim 1, wherein said at least one additive is mixed with the first CMP composition at the point of use or in a container before reaching the polishing table.

16. The method of claim 1, wherein the rheology additive comprises hydroxypropylcellulose (HPC).

17. The method of claim 1, wherein the first CMP composition comprises hydrogen peroxide, alumina-coated colloidal silica, 5-aminotetrazole (ATA), glycine, and water.

18. The method of claim 1, further comprising barrier layer removal.

* * * * *

UNITED STATES PATENT AND TRADEMARK OFFICE
CERTIFICATE OF CORRECTION

PATENT NO.        : 8,304,344 B2
APPLICATION NO.   : 12/026414
DATED             : November 6, 2012
INVENTOR(S)       : Karl E. Boggs et al.

It is certified that error appears in the above-identified patent and that said Letters Patent is hereby corrected as shown below:

In column 21, lines 53 and 54 of claim 3: change "oxidizing agent oxidizing comprises" to
--oxidizing agent comprises--

Signed and Sealed this
Fifth Day of March, 2013

Teresa Stanek Rea
*Acting Director of the United States Patent and Trademark Office*